(12) United States Patent
Doherty et al.

(10) Patent No.: US 6,856,506 B2
(45) Date of Patent: Feb. 15, 2005

(54) TABLET COMPUTING DEVICE WITH THREE-DIMENSIONAL DOCKING SUPPORT

(75) Inventors: John Doherty, Austin, TX (US); Todd W. Steigerwald, Austin, TX (US); Jefferson Blake West, Austin, TX (US); Philip Leveridge, Austin, TX (US); David Altounian, Austin, TX (US); David Cutherell, Austin, TX (US)

(73) Assignee: Motion Computing, Austin, TX (US)

( * ) Notice: Subject to any disclaimer, the term of this patent is extended or adjusted under 35 U.S.C. 154(b) by 0 days.

(21) Appl. No.: 10/175,581

(22) Filed: Jun. 19, 2002

(65) Prior Publication Data

US 2003/0235029 A1 Dec. 25, 2003

(51) Int. Cl.⁷ ................................................. G06F 1/16
(52) U.S. Cl. ..................... 361/683; 361/686; 248/124.1; 312/223.1; 16/329; 345/169
(58) Field of Search ................................. 361/683, 755, 361/686, 679, 685, 730; 248/122.1, 346.1, 346, 918, 489, 510, 289.1, 296, 278, 279, 459, 124.1; 312/235 A, 223.3, 223.1, 223.2; 364/702.1; 16/329, 330, 334, 341, 342; 74/530; 403/93, 94, 97, 106; D14/106; 345/169, 905

(56) References Cited

U.S. PATENT DOCUMENTS

| | | | | |
|---|---|---|---|---|
| 5,133,076 A | * | 7/1992 | Hawkins et al. | 708/141 |
| 5,436,792 A | * | 7/1995 | Leman et al. | 361/686 |
| 5,552,957 A | * | 9/1996 | Brown et al. | 361/683 |
| 5,859,762 A | * | 1/1999 | Clark et al. | 361/686 |
| 5,899,421 A | | 5/1999 | Silverman | 248/175 |
| 5,915,661 A | | 6/1999 | Silverman et al. | 248/465.1 |
| D439,908 S | * | 4/2001 | Gozani | D14/434 |
| 6,282,082 B1 | * | 8/2001 | Armitage et al. | 361/681 |
| 6,594,146 B2 | * | 7/2003 | Frangesch et al. | 361/686 |

FOREIGN PATENT DOCUMENTS

| | | | | | |
|---|---|---|---|---|---|
| JP | 408087351 A | * | 4/1996 | | G06F/1/16 |
| JP | 409251328 A | * | 9/1997 | | G06F/1/16 |
| JP | 410154041 A | * | 6/1998 | | G06F/3/033 |

* cited by examiner

Primary Examiner—Michael Datskovsky
(74) Attorney, Agent, or Firm—William N. Hulsey, II; Hulsey, Grether, Fortkort & Webster LLP

(57) ABSTRACT

The present invention provides a tablet computer and a docking station assembly. This docking station comprises a docking assembly for positioning with three degrees of freedom and having a data connector for mechanically supporting and interfacing with the tablet computer. A support member couples the docking assembly to an expansion base. The base includes a number of ports for interfacing with a variety of peripheral devices or power supplies. These varieties of ports mount to a printed circuit board contained within the expansion base. A flexible printed circuit (FPC) combines the signal pathways for the variety of ports, allowing the signal pathways to travel from the printed circuit board and to the data connector. The tablet computing device has a plurality of contact or touch points positioned on the right and left edges of the tablet to facilitate aligning the tablet to the docking assembly in either a landscape or portrait mode.

19 Claims, 23 Drawing Sheets

TABLET COMPUTING DEVICE WITH THREE-DIMENSIONAL DOCKING SUPPORT

RELATED APPLICATIONS

This application is related to and incorporates herein by reference the following U.S. patent applications: U.S. Utility patent application Ser. No. 10/175,582, entitled "A System and Method of Carrying, Protecting and Displaying a Tablet Computer", filed Jun. 19, 2002, by John Doherty et al.; U.S. Design patent application Ser. No. 29/162,680, entitled "An Expansion Base That Can Be Articulated in Three-Dimensions", filed Jun. 19, 2002, by John Doherty et al.; and U.S. Design patent application Ser. No. 29/162,700, entitled "Tablet Computers, filed Jun. 19, 2002, by Chris Cavello et al.

TECHNICAL FIELD OF THE INVENTION

The present invention relates generally to interfacing personal computer systems, and in particular to tablet computing devices with docking stations. More particularly, the present invention relates to the manner and techniques by which tablet devices interface with docking stations in three-dimensional space.

BACKGROUND OF THE INVENTION

In the field of personal computers, computers are typically made portable and may be carried from place to place. These computers are commonly referred to as "portable personal computers." One type of the portable personal computers is typically referred to as "laptop" computers.

Typically, a laptop computer comprises a clamshell formed by a main body that includes a keyboard unit and a display unit. All of the essential circuitry of the computer, such as the central processing unit (CPU), the power supply, and data storage devices (e.g., floppy or hard disk) are typically incorporated into the main body. A laptop computer is typically a single, integrated unit. All of-the elements of the computer are placed within one housing. The display unit is typically connected to the main body by a hinge. The display unit is placed over the keyboard unit and can be opened upwards by the hinge. The integrated nature of the laptop computers is desirable because it enhances their portability.

One disadvantage associated with the laptop computer is that the laptop requires a relatively large surface space for the user to operate. This is due to the integrated nature of the laptop computers. Both the keyboard unit and the display unit are integrated parts of the computer and cannot be removed from the main body when in use.

There are times when a laptop is not appropriate or convenient. For example, in the field, a meeting, a classroom, or a courtroom, laptops become cumbersome, if not impossible, to use effectively when away from a table or other surface on which they can rest. Keyboard tapping can be intrusive and the open-out clamshell screen can present a barrier to personal interaction.

Tablet computers are intended to overcome these limitations. Tablets come in a variety of sizes and form factors—from clamshell laptops whose screens can pivot and lay flat to create a writing surface, to slim, slate-like devices that can use detachable or desktop keyboards and mice. What makes the tablet unique is their integration of pen and speech input capabilities with state-of-the-art laptop capabilities.

Laptops very effectively serve people who need a computer away from their desk. But a market exists and is growing for people who need a computer when standing. A laptop is not very useful when standing up. People need a mobile product, not just a portable product. Furthermore, Tablets are designed to be a user's primary computer.

In many ways, the tablet is the best of many worlds. Its form factor—roughly the size of a legal notepad and half the weight of most of today's laptop PCs—makes it a truly portable device. Because new operating systems are available that are specifically designed for this application, such as Windows XP designed for the tablet, tablets can support all existing applications without modification, making it as powerful as it is portable.

This makes tablets usable everywhere as a business tool that lets users work the way they want to work. Tablets have the capabilities and full functionality of a high-end notebook. Additionally, tablets allow users to literally write on the screen in a variety of modes, capturing the Brink" as its own data type. Users can use "ink" to take notes, write e-mail, annotate Word documents, PowerPoint presentations and a variety of other documents.

Mobile workers need access to information and communications. Existing PDA and notebook-clamshell implementations are not appropriate for all environments. Field engineers, surveyors, sales representatives, students, and healthcare professionals are just a few of the professionals that can benefit from an improved platform.

These particular customers have often experienced an industrial pen computing device, and are interested in devices with broader functionality to eliminate the need for two computers—a 'real' one at the office and a small form factor product in the field. To replace the 'real' one, any primary computing device must be able to run most Windows applications as well as legacy applications.

As laptops have become more powerful, they have become in part a solution to the two-computer problem. However, laptops do not address all the ergonomic and environmental concerns to become a true solution.

Most laptop computer systems are designed to connect to a docking station, also known as an expansion base. An expansion base is not actually a part of the laptop computer system per se, but is a separate unit that accommodates the laptop. The laptop electrically connects to the expansion base. Because of inherent size and weight restrictions, laptop computers tend to require design tradeoffs such as small keyboards and graphics displays, crude tracking devices, and a limited number of mass storage devices. Expansion bases may include peripheral devices, such as a DVD ROM drive and a keyboard, turning the laptop computer into a desktop system. Accordingly, laptop users can access valuable features such as additional peripheral components including a large graphics display, a traditional mouse and full-size keyboard, hard and floppy disk drives, CD ROM drives, Digital Video Disk (DVD) drives, and other peripheral components. An expansion base may offer connections to local area network (LAN), printers, and modems. Although intended primarily for desktop operation, the utilization of expansion bases has greatly enhanced the usability and comfort of laptop computer systems, especially when the laptop is used frequently in one location, such as in the home or office.

Despite the apparent advantages an expansion base can offer to many laptop computer systems, docking a laptop to such a device often results in conflicts between the expansion base and the laptop required. As a result, the computer users must shutdown and restart their laptop. Often taking several minutes. To date, no one has designed a computer system that overcomes these deficiencies.

It would be desirable to have a functional ergonomic, environmentally sound, plug and play computing device that eliminates the need for shutting down and restarting the computer.

Furthermore, it would be advantageous to use an environmentally hardened touch screen or input pen to eliminate the need for a keyboard, thus allowing the computing device to serve as a work surface.

Finally, it would also be advantageous to be able to couple a plug-and-play computing device to an expansion base in any orientation, thus allowing the device to surface as a functional computer tablet that can be oriented in either a landscape or portrait mode.

Although tablets offer many advantages, many users will be reluctant to move into this tablet concept. These users must be eased into the tablet concept. Therefore, it would be desirable to have a tablet that can function identically to a laptop, with a fold-up screen and keyboard.

Furthermore, if the display unit can be detached from this keyboard, the screen may more effectively be used for presentations. Instead of a pure tablet, it would be desirable to convert between a notebook and a tablet. This allows users to get used to the writing behavior by sometimes writing, sometimes typing.

SUMMARY OF THE INVENTION

Accordingly, a technical advantage of the present invention is its an improved expansion base or docking station. Furthermore, it is another object to provide a three dimensional docking station that is simple to construct and economical to manufacture.

Another technical advantage of the present invention is a docking station that prevents the incorrect disengagement of the portable computer from the docking station while allowing the portable computer to be repositioned in three dimensions.

To achieve these and other technical advantages, the present invention provides a tablet computer using a lightweight housing having an input port and various touch points for interfacing and supporting the tablet computer.

A docking station receives the tablet computer. This docking station includes a docking assembly operable to be positioned with three degrees of freedom, bearing a data connector that mechanically supports and interfaces with the tablet computer. A support member couples the docking assembly to the expansion base, wherein the base comprises a plurality of ports that can interface with a variety of peripheral devices or power supplies. These various ports are mounted to a printed circuit board contained within the expansion base. A flexible printed circuit (FPC) combines the signal pathways for the variety of ports, allowing the signal pathways to travel from the printed circuit board and to the data connector. A plurality of contact or touch points positioned on the right and left edges of the tablet facilitate aligning the tablet to the docking assembly in either a landscape or portrait mode.

The docking assembly attaches to the base assembly by two joints attached to the support member. In one embodiment, the joint has a hinge and the joint comprises a rotating socket wherein the two joints allow the docking assembly to move in three dimensions with respect to the base. The FPC is routed through the first joint and said second joint.

To secure the tablet computer, the docking assembly provides a channel which receives the computing tablet to prevent the tablet from moving in the local Z direction with respect to the docking assembly. The overall shape of the docking assembly forms an "L", "J", or "" shape, wherein an upright channel of the "L", "J", or "U" shape receives an upright edge of the tablet device, when the device is operated in a landscape mode. A horizontal channel receives a lower edge of the tablet device when in a landscape mode.

In certain embodiments the tablets display reorients as the docking assembly rotates. This may be based on rotation past a predetermined angle such as 90°. Furthermore, the reorientation may be automatic in nature. Additionally, a user may direct the table to reorient the display when a function key on the tablet is activated.

The present invention provides a significant advantage by allowing the tablet to be positioned in three dimensions without placing tearing or twisting stresses on the signal pathways.

This is achieved through the use of FPC, wherein several signals are mapped to one FPC. Separation zones within the FPC prevent cross-contamination of the signals FPC. These signals may include: DC power, AC power, VGA, USB, analog audio, digital audio, analog video, digital video, LAN, WAN, and IEEE 1394 or other signals known to those skilled in the art.

The tablet computer associated with the present invention provides a full computing platform with options for pen and audio input characteristics. This tablet computer provides a portable, non-intrusive, instantly available, plug-and-play platform capable of running applications without requiring a keyboard. This platform provides a powerful computing platform to be used for presentations, in meeting, reading and editing documents, or for use as an electronic book or notepad.

The tablet computer provides a most capable mobile computing device, having long battery life, thin ergonomic designs, optional wireless capability, and a lightweight form factor.

One embodiment runs a specialized version of Microsoft's Windows XP operating system. This version has all of the features of Windows XP Professional with additional features specific to the Tablet computing environment. This allows all existing Windows software applications to run on this computing platform.

This computing platform adds functionality for users to run Windows or other like OSS and their applications using a pen, annotate documents, and create handwritten documents using electronic ink for later reference or even conversion into text. Tablet computers can be placed into docking station such as one provided by the present invention at a desk to support larger monitors, network connection, keyboard, mouse, and other peripherals as known to those skilled in the art.

The tablet computer platform is more than a portable computer. The addition of both ink and speech as data sources for these devices means new solutions will extend the computing platforms in ways not easily replicated by mainstream notebook computers or handheld devices. Examples of these new solutions include signature authentication for document binding and paperless workflow, microphones for medical dictation directly into a tablet computer, electronic whiteboard software that allows the device to be an input device to a projector for real-time digital whiteboard usage, and many others.

The present invention provides a carrying case for a computing device that substantially eliminates or reduces disadvantages and problems associated with previously developed systems and methods.

More specifically, the present invention provides a carrying case or portfolio for holding a tablet computer, the carrying case being foldable between a closed position and an open position. The case comprises an upper side divided into at least three stiffened sections. These sections include an uppermost section having at least one tab, an upright section, and a horizontal section. A lower side couples to the upper side to form the exterior of the case. A formed metal frame within the case retains the tablet computer. Horizontal and/or vertical stops limit the motion of the tablet computer relative to the frame. The frame assembly is held within the case by a retaining piece flexibly attached to the case. The frame includes at least one track operable to receive the tabs on the uppermost portion of the upper side, and wherein the tab(s) can be repositioned in the track(s).

The lower side retains a keyboard and or pointing device in communication with the tablet computer. This keyboard communicates with the tablet by either a wired or wireless connection. For example a USB connection may be made between the tablet and keyboard. The keyboard may be retained by a fastening system such as a hook and loop fasteners to this lower side or other like systems as are known to those skilled in the art.

As the tab(s) are repositioned downwardly from an upper edge of the frame assembly within the tracks of the frame assembly, the upright section and horizontal section form a brace that supports the tablet computer firmly in a semi-upright position. Fasteners or indentations at predetermined locations within the tracks secure the tab(s) to brace and position the frame at predetermined angles.

To further protect the tablet, a fastener may secure the upper side to the lower side and close the carrying case. One such fastener is a strap secured to the sides with a buckle or snap. Another fastener is a zipper type that completely encloses the sides.

The sides of the case may be constructed from nylon, PVC, water-resistant materials, leather or other type material known to those skilled in the art that protects and the tablet from the environment and provides the desired look and feel.

The present invention provides an important advantage by allowing users to interface with a tablet computer in a manner and form similar to that of a traditional laptop. Furthermore, the case forms a brace that allows the tablet to be easily positioned for viewing. This is true whether the tablet is used for a presentation or is to be repositioned for more comfortable viewing.

This frame also provides a benefit in that the frame in certain embodiments may be removed or detached from the case and serves as a display stand or mount for the tablet.

The carrying case provided by the present invention serves to protect a tablet computer and enable users to interact with the tablet in the same manner they would with a traditional laptop. Thus, users may be eased into the tablet environment. The carrying case also serves to protect the tablet and keyboard, if present, from the environment. Horizontal and vertical stops allow easy access to the tablet without opening the entire case. This is particularly advantageous in an airport where one must remove laptops or other similar devices for inspection. The upper vertical stop may be formed of a flexible material that bends to allow the tablet to be withdrawn from the case for inspection or easy access in a space-limited environment.

The present invention allows a tablet and keyboard to be easily carried from place to place as an integrated unit. Furthermore the present invention allows the tablet and keyboard to be repositioned in an ergonomical and comfortable position. The display may be oriented and fixed at a variety of angles allowing users to optimize the position of the display for their unique circumstance.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIGS. 4A through 4F are a plan view of one data connector used in the present invention;

DETAILED DESCRIPTION OP THE INVENTION

Preferred embodiments of the present invention are illustrated in the FIGUREs, like numerals being used to refer to like and corresponding parts of the various drawings.

The present invention provides a tablet computer that is received by a docking station. This docking station comprises a docking assembly operable to be positioned with three degrees of freedom, bearing a data connector that mechanically supports and interfaces with the tablet computer. A support member couples the docking assembly to an expansion base, wherein the base comprises a plurality of ports that can interface with a variety of peripheral devices or power supplies. These various ports are mounted to a printed circuit board contained within the expansion base. A flexible printed circuit (FPC) combines the signal pathways for the variety of ports, allowing the signal pathways to travel from the printed circuit board and to the data connector. The tablet computing device has a plurality of contact or touch points positioned on the right and left edges of the tablet to facilitate aligning the tablet to the docking assembly in either a landscape or portrait mode.

One embodiment is illustrated in FIGS. 1A–1B, and 2A through 2E. The tablet computer 10 aligns itself automatically and couples to the base assembly 12. This portable computing device comprises a tablet with a display screen/work surface 14. Tablet computer 10 may be operated in either a portrait or landscape mode and uses a touch sensitive screen to facilitate users interface with software applications. Tablet computer 10 may receive input in the form of handwritten notes, or electronic ink sampled by display screen/work surface 14, which also serves an a touch screen. This data is converted into commands or input for the various applications running within tablet computer 10. A series of function keys 16 allow direct access to various functions internal to tablet computer 10.

Base assembly 12 couples to tablet computer 10 in three-dimensional-space. This differs significantly from traditional docking/port replicator systems that operate in one specific plane or orientation. Standard docking systems, for laptops or personal data assistants (PDA), dock in a single orientation.

Figure 1A:
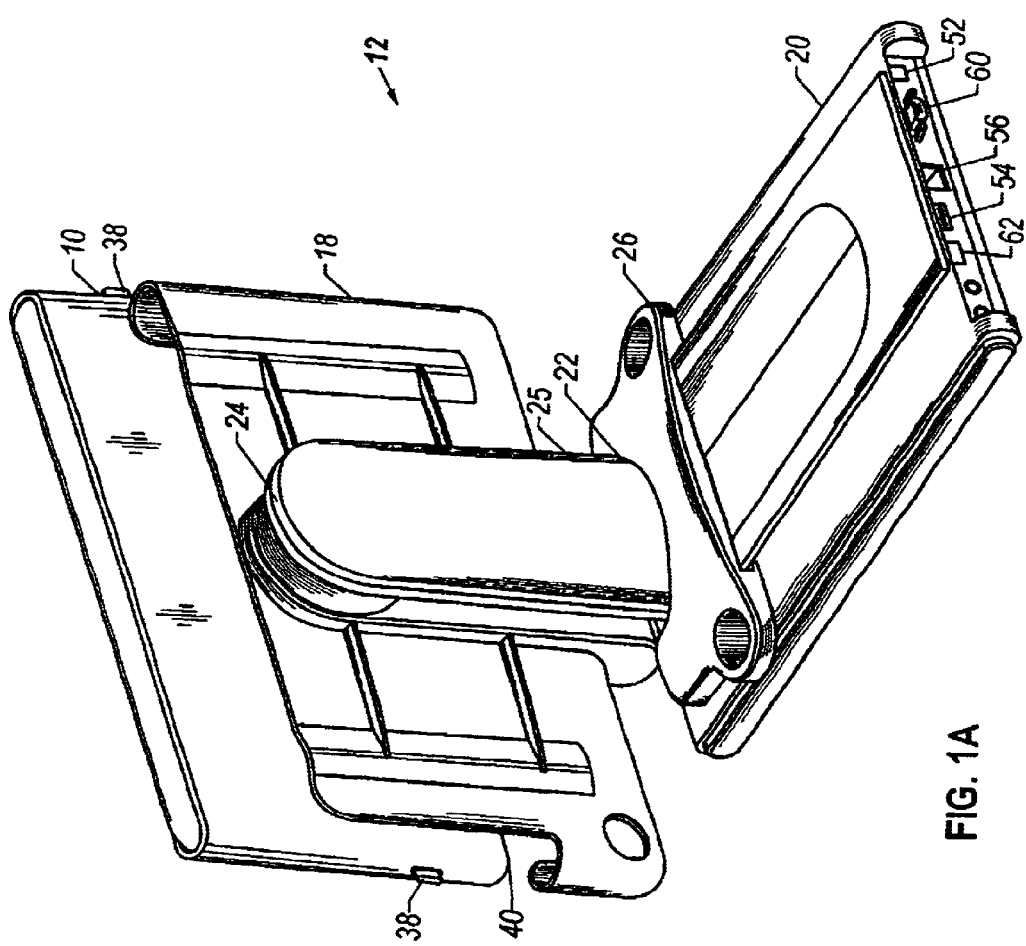
FIGS. 1A and 1B provide an isometric view of the extension base provided by the present invention.
Figure 1B:
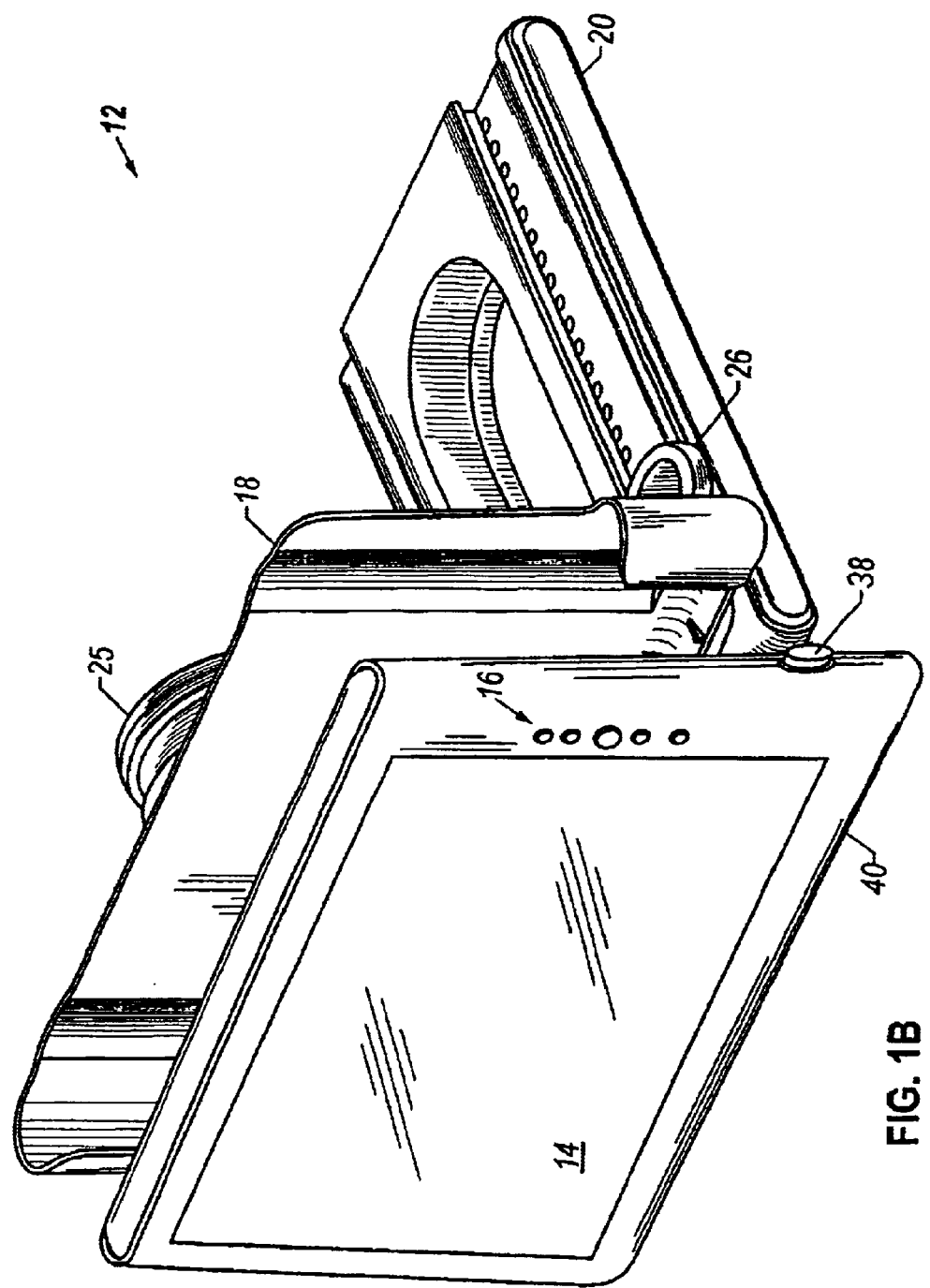

Base assembly 12 of the present invention, as shown, in FIGS. 1A and 1B receives tablet computer 10 with docking assembly 18. Docking assembly 18 is positioned with respect to base assembly 20 in three-dimensional space through a support member having at least two articulated joints. The articulated joints are isometrically shown in FIGS. 1A and 1B and in the vertical position in the plan views provided in FIGS. 2A–2E. The joints comprise a hinged joint 22 which allows docking assembly 18 to be positioned radially with respect to base assembly 20. Base assembly contains all the peripheral ports and may also provide a storage slot for a stylus used to interface with the slate or tablet computer. A second pivot joint 24 allows docking assembly 18 to rotate about pivot joint 24 in a local X-Y plane parallel to support member 25. Support member 25 flexes radially to allow docking assembly 18 to be positioned radially in a plane divergent from base assembly 20. By locating pivot joint 24 roughly at the center of tablet computer 10, the users may comfortably write or apply pressure on any portion of display screen/work surface 14. Furthermore, brace 26 provides firm support and restricts unwanted movement of support member 25, allowing tablet computer 10 to serve as a steady work surface. Support member 25 facilitates the touchscreen interface for the user by allowing users to adjust tablet computer 10 to any angle that the user finds comfortable. Hinged joint 22 may employ a light friction hinge to couple support member 25 to base assembly 20. This hinge may allow any angle of rotation. One embodiment allows up to 90° of rotation while another embodiments allows more than 90°. In particular, one embodiment allows motion of support member 25 from 0°–95°. This range allows tablet computer 10 to be rotated past or placed in a position past vertical to fulfill European monitor standards. These standards help address glare issues associated with monitors.

Pivot joint 24 allows docking assembly 18 to be rotated, with respect to support member 25. Thus tablet computer 10 can be quickly positioned in either a portrait or landscape mode. Software incorporated into the base assembly 20, or mechanisms incorporated into the docking assembly 18 support member 25, or tablet computer 10, may automatically direct that the display screen/work surface 14 be reoriented as tablet computer 10 is rotated 90 degrees. The device may automatically re-orient the display screen. One such mechanism used to detect this reorientation may comprise a switch located within the dock that realizes that the tablet computer 10 has been rotated, and results in tablet computer 10 re-orienting screen/work surface 14. This switch may not be dependent on local vertical, but will orient and re-orient based on the original position and location of tablet computer 10. This mechanism may be limited to only examining the rotation of pivot joint 24 to determine the orientation of the display. Other embodiments, may incorporate an angular detect, or a reference to local vertical to automatically orient screen/work surface 14. The device shown in FIGS. 1A and 1B uses a detect switch to determine any orientation change of 90 degrees.

Several unique features have been incorporated into tablet computer 10, base assembly 12 and docking assembly 18 in order to facilitate coupling computing tablet computer 10 to base assembly 12 in a dynamic three dimensional environment with plug and play capability.

The present invention addresses problems encountered in docking, tablet computer 10 to base assembly 12 in three-dimensional space that have not previously been addressed. Docking assembly 18 may be located at any angle from horizontal to vertical relative to the base assembly 20. Further docking assembly 18 may be rotated 90 degrees relative to support member 25. The present invention couples these devices together while experiencing several degrees of freedom not normally addressed in docking computing devices to their cradles or docking units. The present invention also may dock tablet computer 10 in a portrait mode, landscape mode, and in either a horizontal or vertical plane, or any angle in between. Docking assembly 18 and touch points or contact points 38 located on the cases of tablet computer 10 allow the tablet to be docked in either mode. Furthermore, the present invention, when docked, facilitates the use of the tablet-computing device. The present invention permits orienting screen/work surface 14 in the landscape mode as a monitor, wherein base assembly 12 serves as a support for tablet computer 10 or in the portrait mode as a work surface.

By facilitating the docking of tablet computer 10 to docking assembly 18, users may mechanically "grab and go" with tablet computer 10. This is a significant feature when coupled with the ability to re-orient screen/work surface 14. Equally important is the ability to electrically plug-and-play or "grab and go."

In other instances, it may be desirable to automatically direct the tablet computer 10 to re-orient itself according to the orientation of docking assembly 18 relative to base assembly 20 upon docking.

The mechanisms used to detect and re-orient screen/work surface 14 do not necessarily automatically re-orient screen/work surface 14 when tablet computer 10 docks. Rather, in some instances it is preferred that screen/work surface 14 remain in its current orientation until a user specifies that that orientation be changed via function keys 16, or the rotation of docking assembly 18 about pivot joint 24.

Fundamental mechanics differentiates tablet computer 10 in landscape mode versus portrait mode. Docking assembly is oriented in the landscape mode, in FIGS. 1A and 1B, 2A–2E and 3. Another aspect, unique to the present invention is brace 26. Brace 26 holds upright support member 25. Historically products have used a kickstand like device to position the display in an upright position. This approach is inherently unstable, when the device is moved further from vertical. As the angle of the tablet departs vertical, the downward force is moved further and further away from the kickstand interface with the underlying horizontal surface. The brace provided by the present invention allows the work surface of tablet computer 10 can remain rigid when in a vertical or semi horizontal position. This is further aided by the fact that support member 25 couples firmly at the center of the tablet. A light friction hinge or other similar joint as is known to those skilled in the art may be used for hinged joint 22 to maintain the support arm in an upright or semi-upright position without the use of brace 26. However, brace 26 decreases the load placed on the fringe in an upright position.

Figure 2A:
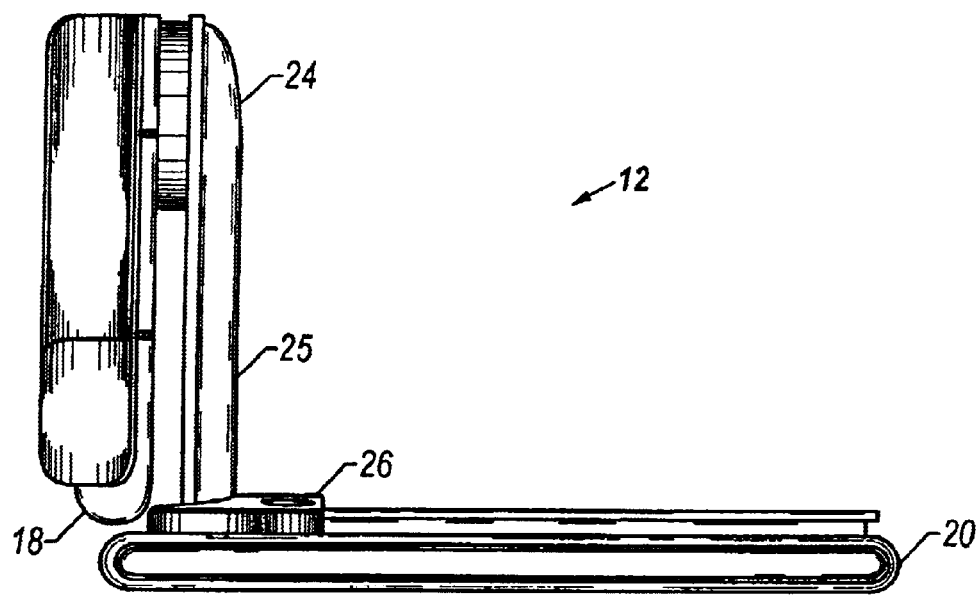
FIGS. 2A, 2B, 2C, 2D, and 2E provide plan views of the extension base.
Figure 2B:
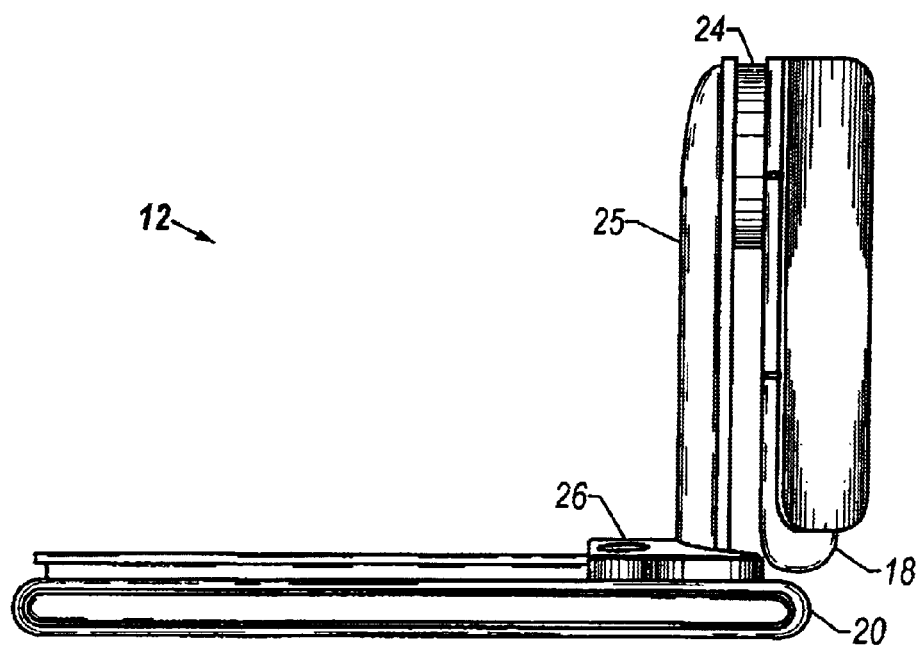
Figure 2C:
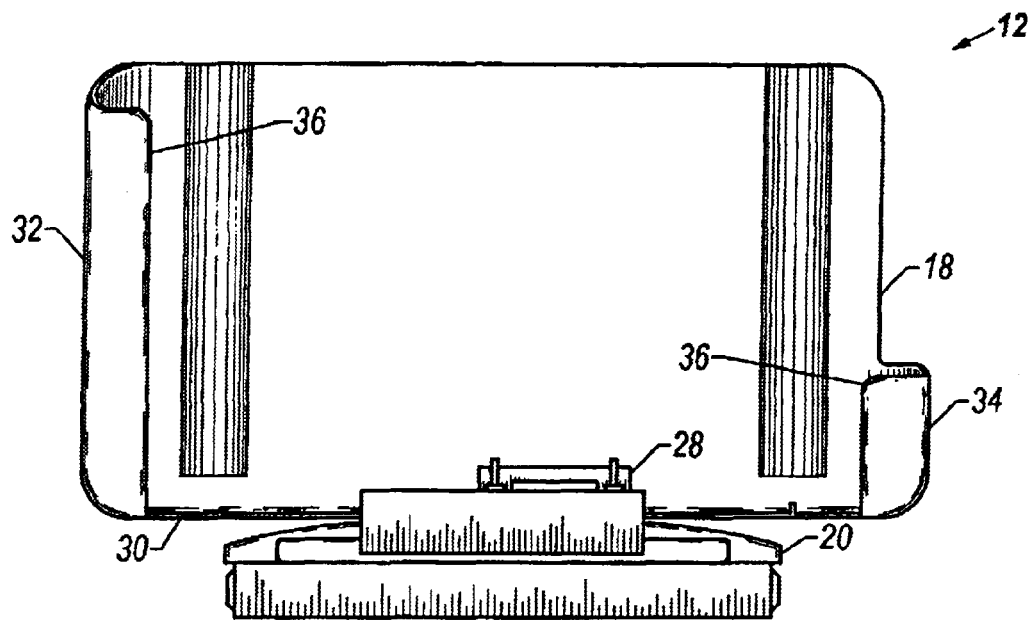
Figure 2D:
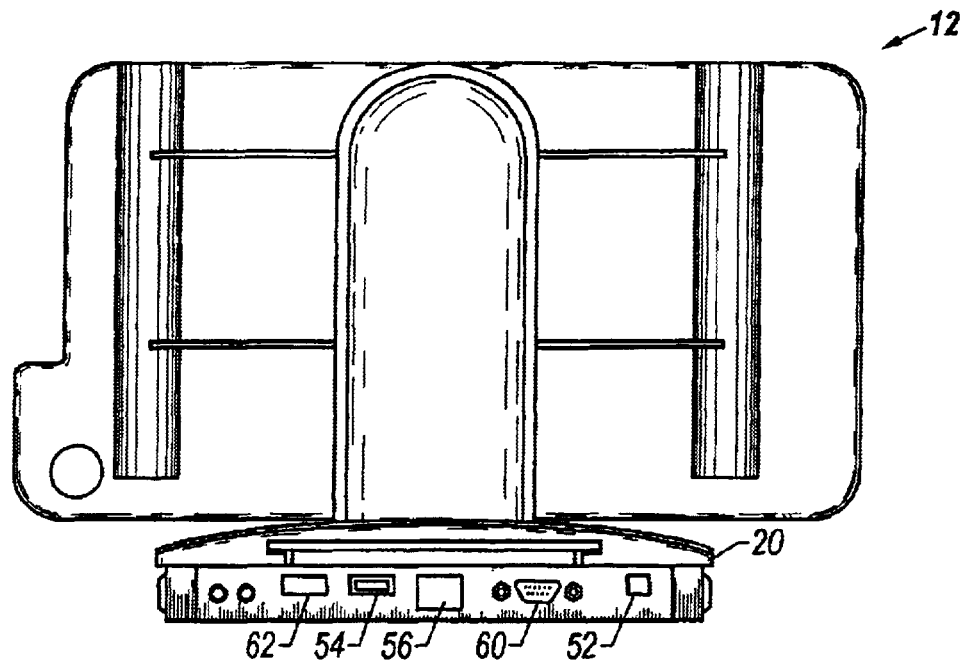
Figure 2E:
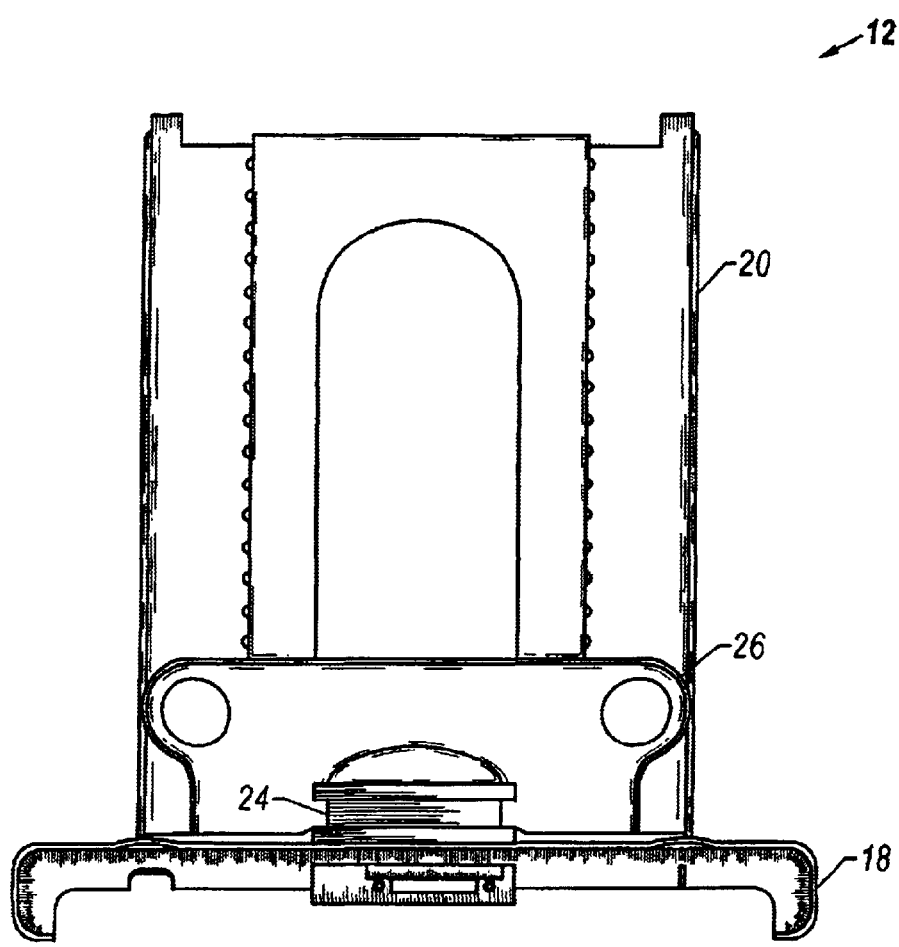
Figure 3:
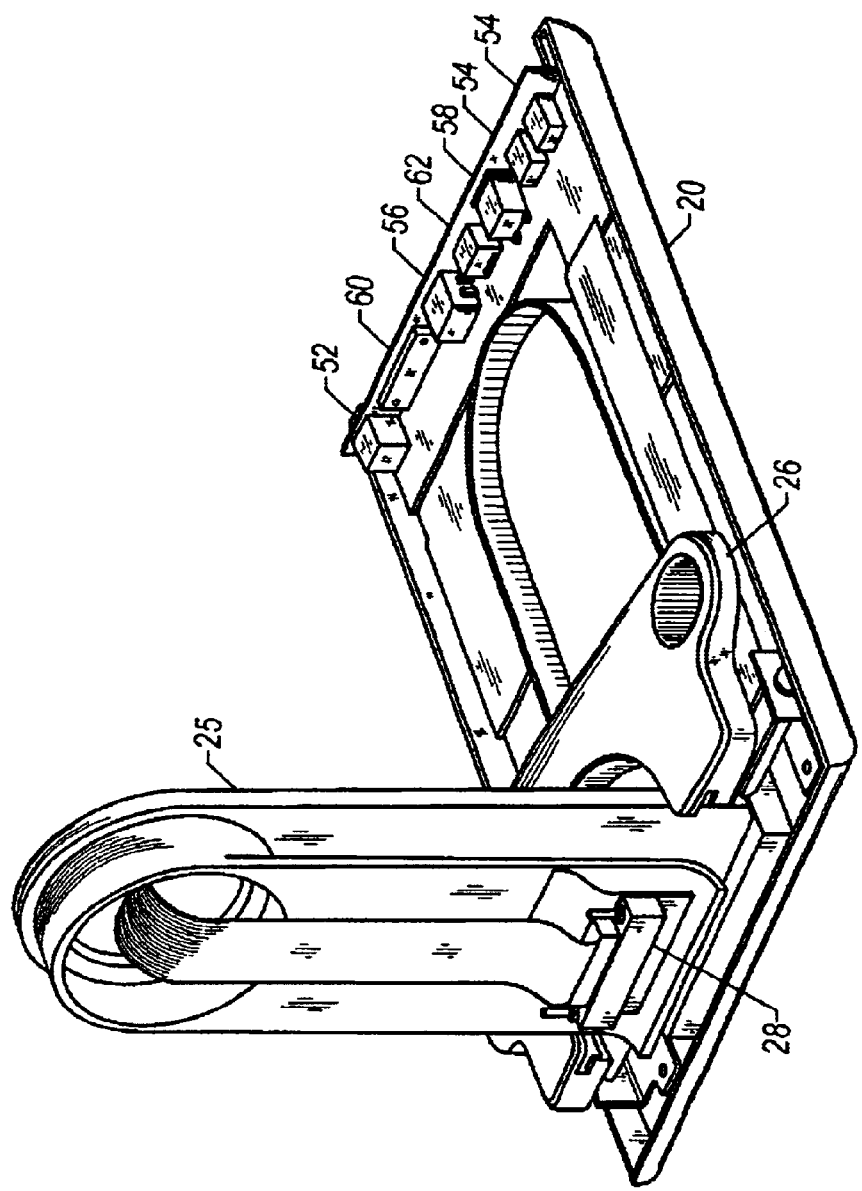
FIG. 3 depicts an isometric view of the extension base with the docking assembly cutaway.
Figure 4A:
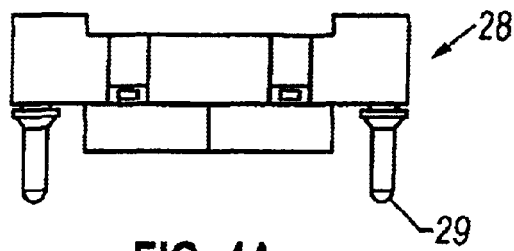
Figure 4B:
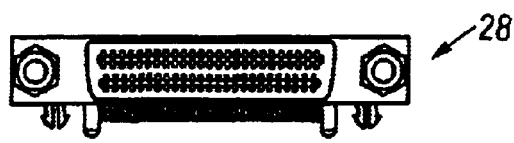
Figure 4C:
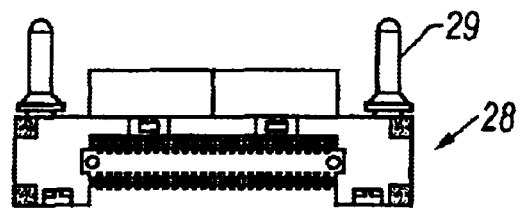
Figure 4D:
Figure 4E:
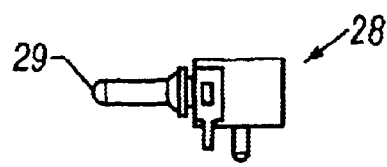

Referring now to FIGS. 2C and FIG. 3, docking assembly 18 has been cutaway to reveal docking connector 28. In landscape, gravity pushes the tablet device against lower edge 30 and docking connector 28. Thus, gravity helps dock tablet computer 10 to docking assembly 18. In this orientation, one need merely control the computing device's horizontal motion to align the I/O port of the computing device to the docking connector 28. If the product is to be docked in a portrait mode, gravity no longer assists the connection between the I/O port of the computing device to data docking connector 28. Rather, gravity now pushes tablet computer 10 against left edge 32 of docking assembly 18, which is now in a horizontal position. This changes the stresses and support points associated with docking connector 28. Also changed are the reference points associated with making a successful dock. In portrait, the references are located off a different surface.

To dock tablet computer 10 to docking connector 28 in the portrait mode, reference is made to right edge 34 of tablet computer 10 and left edge 32 of docking assembly 18. This requires increased tolerances between the reference points along left edge 32. To facilitate this, tablet computer 10 has several contact points 36 along left edge 32 and right edge 34 of tablet computer 10. These contact points 36 may be changed in size and shape to account for internal tolerances of the overall construction of the individual pieces of tablet computer 10. Contact points 38 of tablet computer 10 are located as shown in FIG. 1B, on the left and right edge. These touch points account for the tolerances of various pieces to achieve a proper connection. These tolerances accumulate edge from the internal boards and other components comprising various fasteners, pads and the I/O connector of the computing device.

Contact points 38 adjust to account for the actual manufactured tolerances of the component pieces. The integrated tolerance are known when the parts are integrated. Adjustable contact points 38, compensate for the actual distribution of integrated tolerances of component pieces. The manufacture of the touch points is set at a repeatable height that accounts for the distribution of integrated tolerances. Therefore, the touch points provide a repeatable method and means for docking tablet computer 10 to docking assembly 18.

This concept when applied to the manufacture of plastic parts such as docking assembly 18, provides many benefits. Parts are typically repeatedly reproduced, but not accurately produced. Thus, the present invention accounts for the distribution of manufactured parts with the adjustable touch points. Thus, the present invention provides a significant improvement in the method of manufacture by relying on repeatability as opposed to accuracy. The integrated error associated with the tolerances of the component parts is compensated for at the end of manufacturing process as opposed to stressing the accuracy of each individual component manufacturing processes. This is achieved by taking the component parts and a statistical analysis of each component part determines the manufacturing distribution of the individual parts.

Mechanically, the touch points ensure that when tablet computer 10 enters docking assembly 18, no matter the orientation, tablet computer 10 aligns itself within the docking assembly 18. The lower touch points are located near the bottom edge 40 of tablet computer 10. These points are located at or near the lower edge, when to ensure that when tablet computer 10 enters docking assembly 18, that the lower contact points 38 contact the left and right edges of docking assembly 18 first. When the tablet is docked in a portrait mode, touch points still center the tablet within docking assembly 18. By centering the tablet, the mating of docking connector 28 to the I/O port of tablet computer 10 is facilitated.

The upper contact points 38 on the left side of tablet computer 10 becomes apparent when docking assembly 18 is rotated 90 degrees from a landscape to a portrait mode. After docking assembly 18 has been rotated, the critical contact points are on the left edge of tablet computer 10.

Efficient manufacture of docking assembly 18 and bottom edge 40 of the tablet demonstrates additional technical advantages of the present invention. However, it is extremely difficult to manufacture component pieces maintaining three-dimensional tolerances over a large production run. Reference points are not located on the front or back of the tablet. This is due to the fact that the depth of the device is much smaller when compared to the length or height of the computing device. Therefore, the tolerances and errors experienced in the depth of the device are much smaller than those experienced in either the width or height of the device. Errors associated with component pieces accumulate over large distances, in a molded plastic piece. The larger the component piece is, the larger the overall change of that component piece. Furthermore, the "L", "u", or "J" shaped channel is tapered to receive the tablet. It should be noted that there might be some concern that when a manufacturer's process is altered, that the statistical average of the produced component pieces may change, shifting the tolerances associated with that piece.

The process control tolerances of the tablet and touch points with respect to docking assembly 18 allow the I/O port of tablet computer 10 to be successfully located in close proximity, perhaps plus or minus 2 millimeters, of the docking connector 28. This ensures that the reception nuts of the I/O port assembly receive guide pins on docking connector 28.

That the method of manufacture of this product differs significantly from prior products in that previously one would specify the component pieces to the manufactured with exact tolerances. Now, although tolerances are specified, the fit is determined not by the tolerances, but the repeatability within those tolerances.

The manufacturing errors of the component parts is determined using statistical analysis of manufactured parts, then contact points compensate for the integrated error of all of the components to facilitate the connection while minimizing stress on the docking connector 28.

Although the present invention introduces many novel mechanical features, novel electrical features are also introduced. The present invention provides a significant advantage over prior existing systems in that a flexible print cable (FPC) provides a communication pathway or circuit between the various ports and functions associated with base assembly 20 and the docking connector 28. As shown in FIG. 3, the many functions of a notebook base, including the power input 52, USB ports 54 and 56, network connection 58, serial connection 60, and parallel port connection 62 are combined into a single FPC 64. Power inputs 52 through 62 are affixed to a printed circuit board 66 contained within the base. By mapping these signals to a single FPC, a plurality of individual wires and their inherent complexity from individual ports to docking connector 28 are eliminated. FPC 64 is capable of carrying DC power, VGA, USB, digital audio, analog audio, Ethernet, IEEE 1394, and other data signals as known to those skilled in the art. A storage slot for an interactive stylus with a reminder function to return the stylus to the base based on an auto detect of the stylus may be incorporated into the base.

FIGS. 4A, 4B, 4C, and 4D provide various views of one embodiment of docking connector 28. Docking connector 28 mates with the I/O port of tablet computer 10. To facilitate docking in a variety of positions, the I/O port is mounted directly to bottom edge 40 of tablet computer 10. Guide pins 29 help align data connector to the I/O port. This further helps to eliminate errors and tolerances associated with the the tablet. This further eliminates integrated errors of components of the data connector to fasteners, which in turn couple the data connector/fastener combination to a maze of internal components each having its own specific tolerances.

For weight and strength purposes, bottom edge 40 may be manufactured from magnesium or other similar materials as is known to those skilled in the art. Magnesium provides the required strength and lightweight properties for the frame of the tablet.

Although the docking assembly 18 is shown in an L or J shape, it is conceivable to use a U-shape as well. The embodiment shown in FIGS. 1A–1B, uses the "L" shape for docking assembly 18. This is repeated in FIGS. 2A–2E. Although a U-shape could be utilized, the second upright of the U-shaped docking assembly, may potentially cover functions keys located on one upright edge of the tablet. Furthermore, the rotation of hinged joint 22 is limited to 90 degrees with an L-shaped assembly, while 180 degrees of rotation are possible with a U- or J-shaped assembly. Support for the computing device at other angles is allowed with a J- or U-shaped docking assembly.

In other embodiments, tablet computer 10 may dock with a docking assembly 18 that is coupled to port mechanism coupled to a support member, wherein the support mechanism is directly mounted to a horizontal or vertical surface, thus allowing a wall mounted docking assembly.

Figure 5:
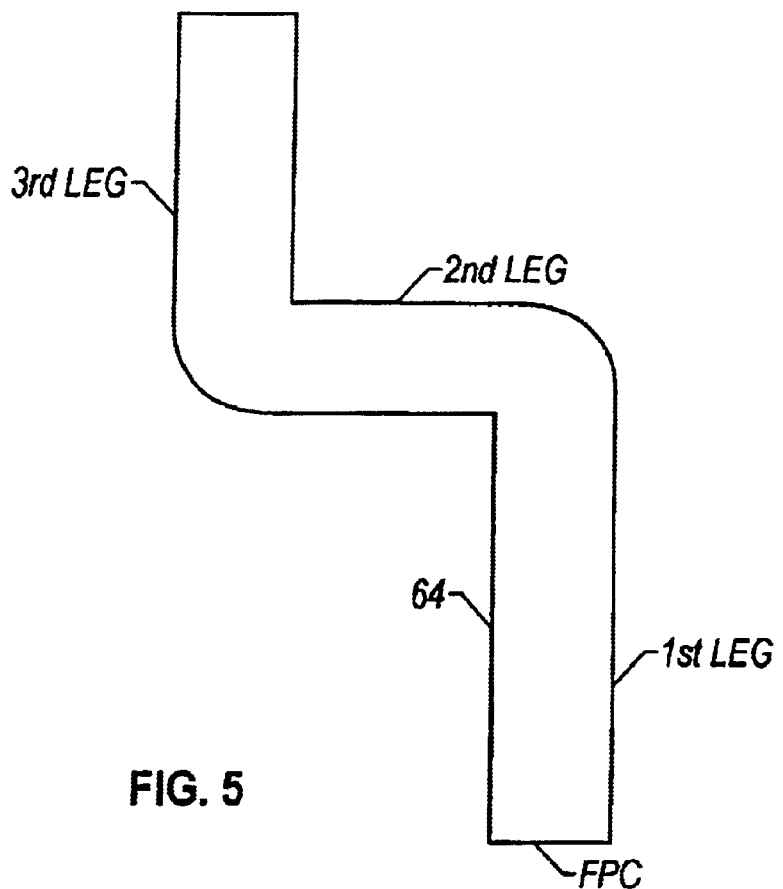
FIG. 5 is a two-dimensional outline of the flexible printed circuit (FPC) used in the present invention.
Figure 6:
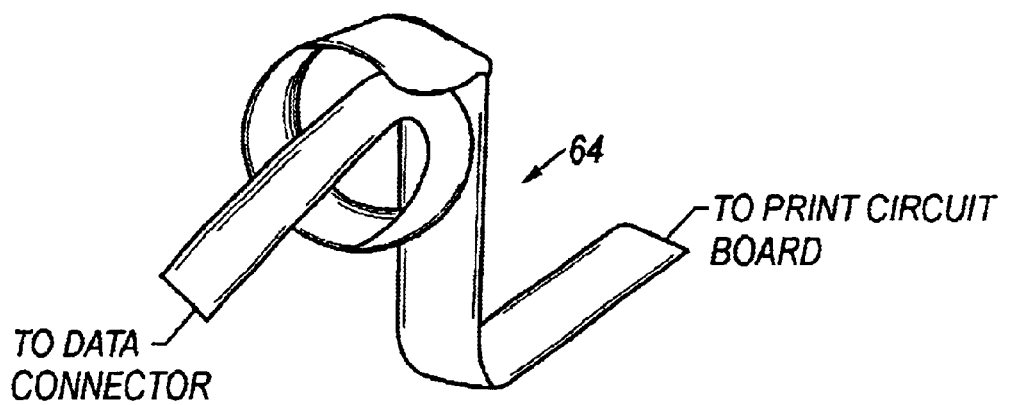
FIG. 6 provides an isometric view of the FPC within the dock.

FPC 64 allows these signals to traverse a tortuous path. Slack along the primary axis of the FPC allows FPC 64 to traverse hinged joint 22. A more complex solution may be required in order to allow docking assembly 18 to rotate about pivot joint 24. A two dimensional view of one possible layout of this FPC is provided in FIG. 5. FIG. 6 provides a view of FPC 64 in three dimensions wherein docking assembly 18 (FIG. 1A), pivots about pivot joint 24 (FIG. 1A), without placing tear stress on FPC 64.

Referring to FIG. 1A, at pivot joint 24, the primary axis of the FPC turns 90 degrees with FPC 64 to form the second leg. A second bend of 90 degrees connects the second and third legs of the FPC. To allow docking assembly 18 to rotate 90 degrees the second leg is folded back in a cylindrical form wherein no tear stresses are associated with rotating docking assembly 18. When docking assembly 18 is rotated, slack is merely taken in or out of the cylinder or spiral formed by the second leg of FPC 64. The cylinder may change from 360 degrees to 270 degrees or any other incremental change of 90 degrees, preventing any tearing stresses. Tearing stresses would be perpendicular to the signal pathways along the first, second or third legs of FPC 64.

Figure 7A:
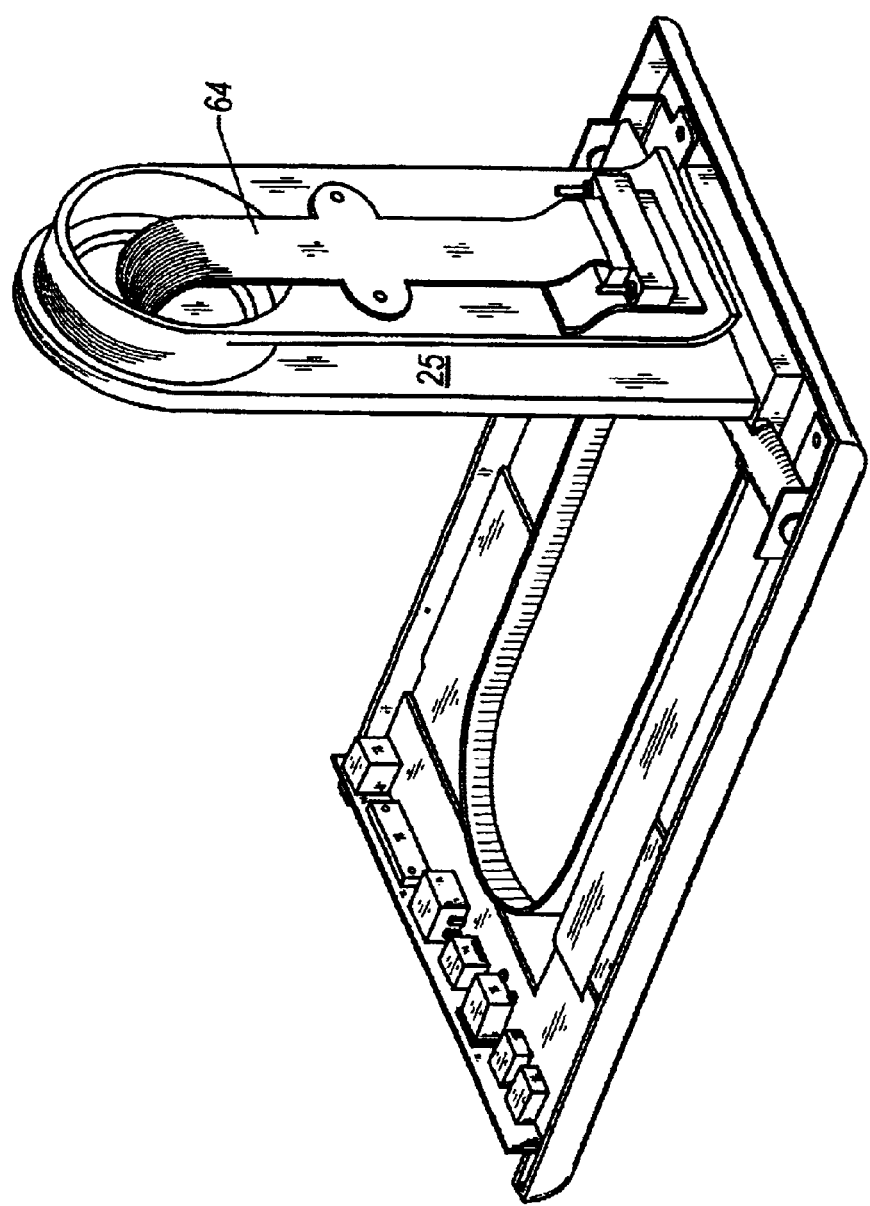
FIGS. 7A, 7B, and 7C, depict a second embodiment for the layout of FPC within the support member.
Figure 7B:
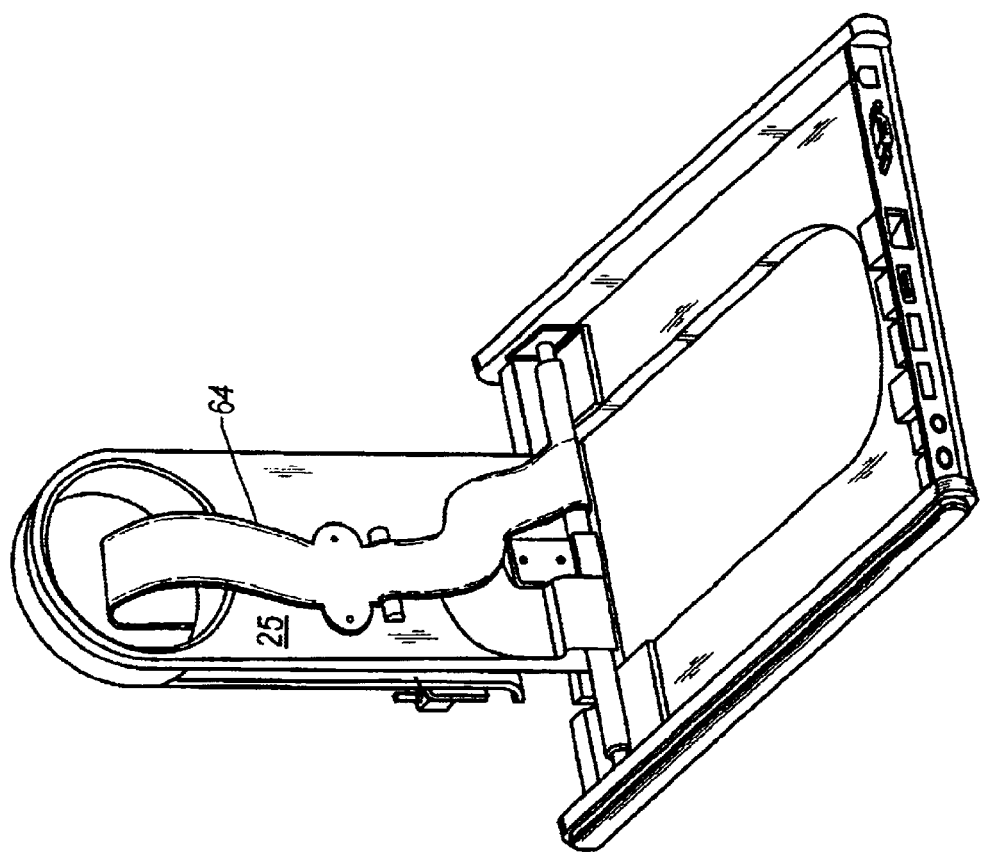
Figure 7C:
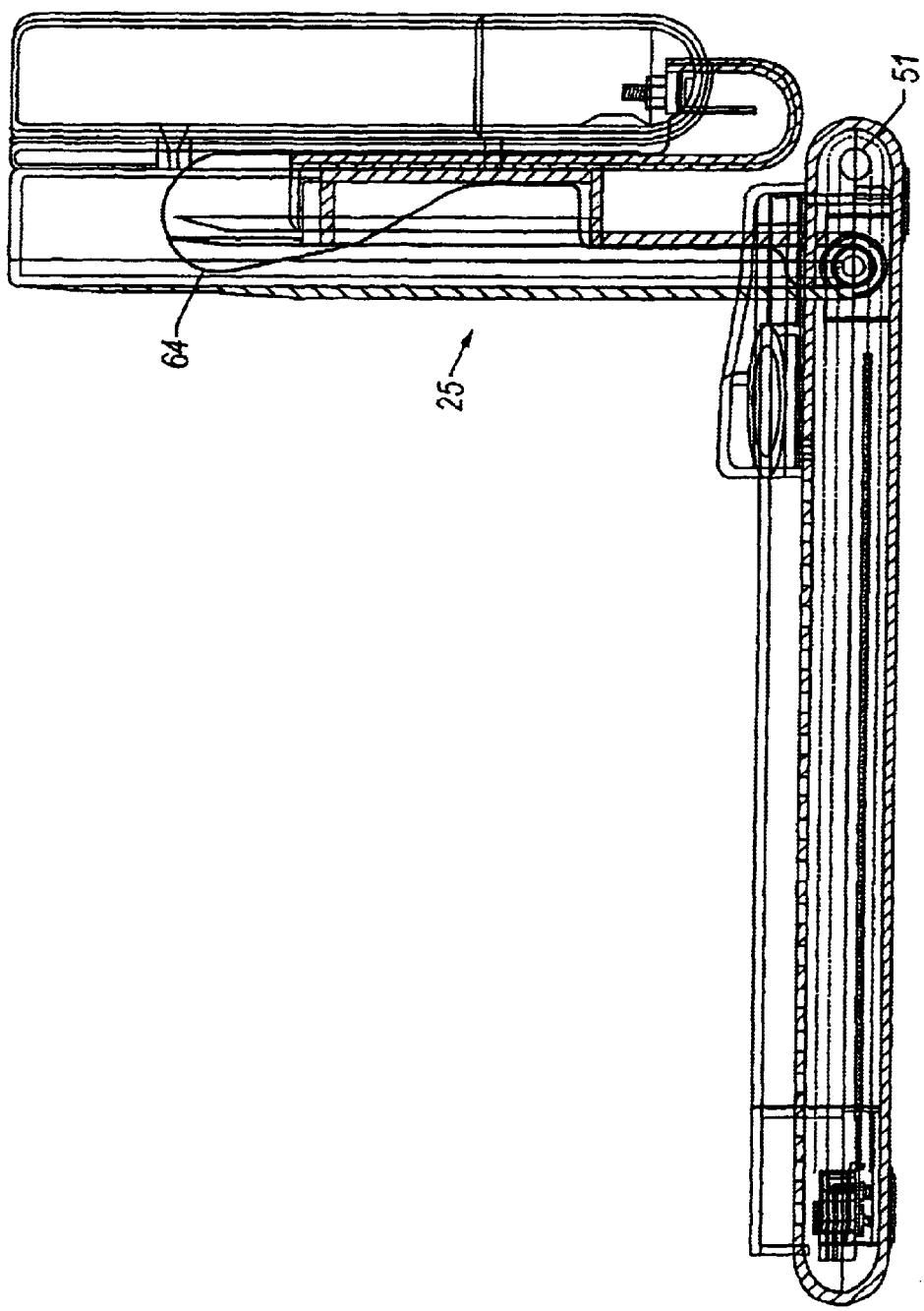
Figure 8:
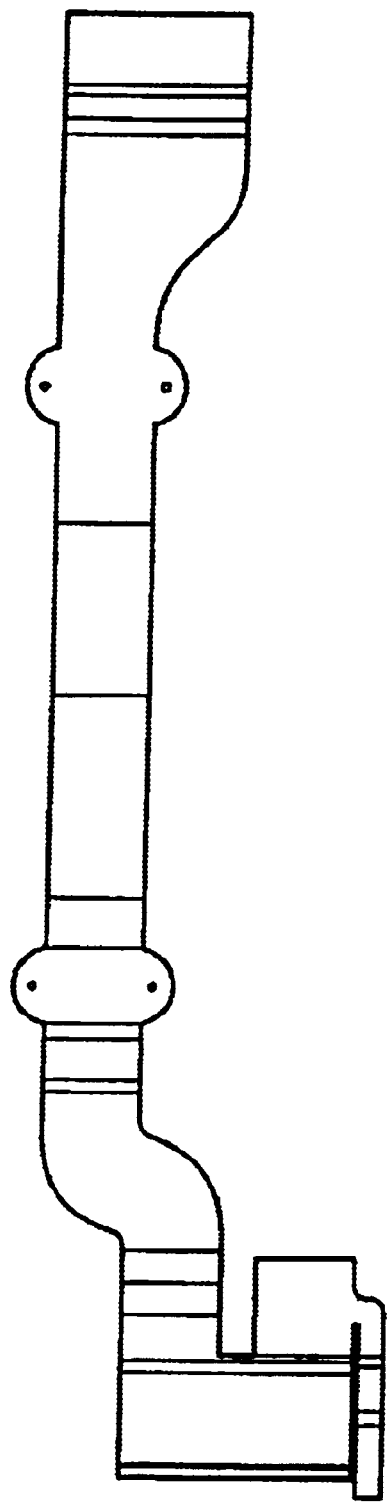
FIG. 8 provides a two-dimensional outline of an additional embodiment of FPC within the present invention.

Alternatively, an enlarged cavity may be formed in the support member 25. This is illustrated in FIGS. 7A, 7B, and 7C. Here the flex is rigidly attached to the front and back interior of support member 25, thus allowing the flex path cross-section illustrated in FIG. 7C to not be restricted by the interior free space within the support member. The observed flex cross-section change may be minimized by minimizing the horizontal separation between the flex rigidly attached to the front of the support member and the flex rigidly attached to the back interior cavity of the support member. Thus, the FPC geometry shown in FIGS. 5 and 6 may be simplified to the two-dimensional layout of FIG. 8. Additionally, a slot 51 for an extra stylus that does not interfere with the internals of base assembly 20 is shown in FIG. 7C.

Electrically, FPC 64 allows several high speed data signal pathways such as fire wire, LAN, digital audio, analog audio, Ethernet, IEEE1394, USB, as well as AC or DC power signals to be combined on a single FPC. Other solutions, such as a radio or wireless dock are currently constrained by the bandwidth. FPC meets the requirements of the various high-speed data connections. Furthermore, FPC, provides more security than is provided by wireless applications.

Incorporating FPC into a hinge is known to those skilled in the art and is commonly done with notebook displays. The use of FPC greatly simplifies and enhances the electrical problems encountered by the docking base unit associated with the present invention. The use of FPC allows for the present invention to meet EMI requirements, USB 2.0 requirements, both with high quality signals that are potentially better signal qualities than that of conventional wire.

By manipulating the geometry of the FPC, one is able to achieve the same connections that would require by twisting a great number of individual wires without any twisting action. Rather, the FPC flexes as it was designed to flex. FPC provides a straight run for the signal pathways associated with powering and transferring information, high-speed information, at a high data rate.

Challenges exist in mapping these various low and high frequency signals within a single FPC.

Figure 9:
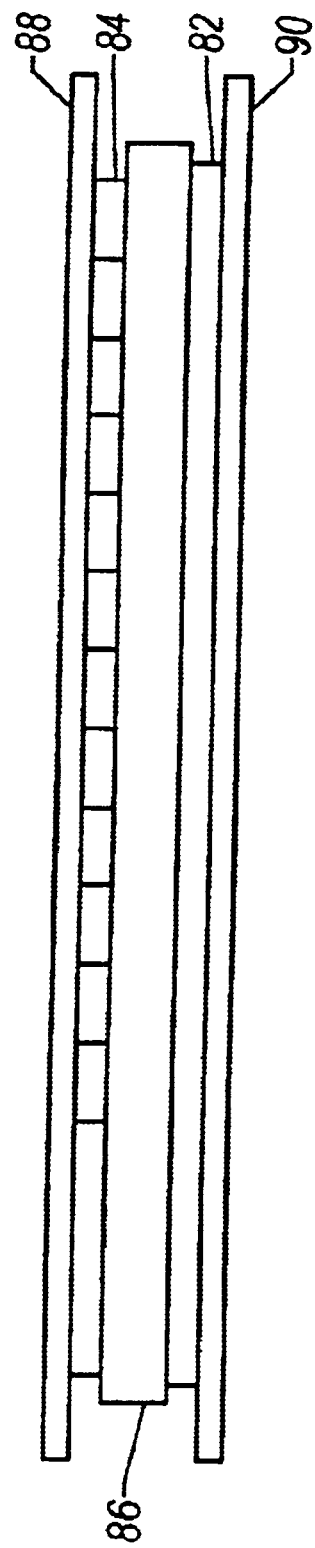
FIG. 9 provides two cross-sections of a FPC.
Figure 10A:
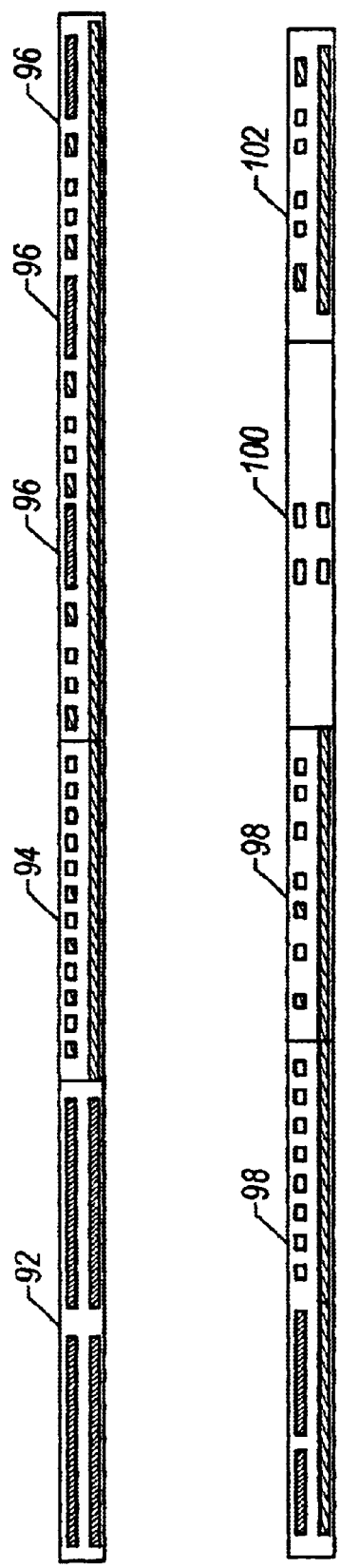
FIGS. 10A and 10B provide cross-sections of FPC used by the present invention with various signal traces.
Figure 10B:
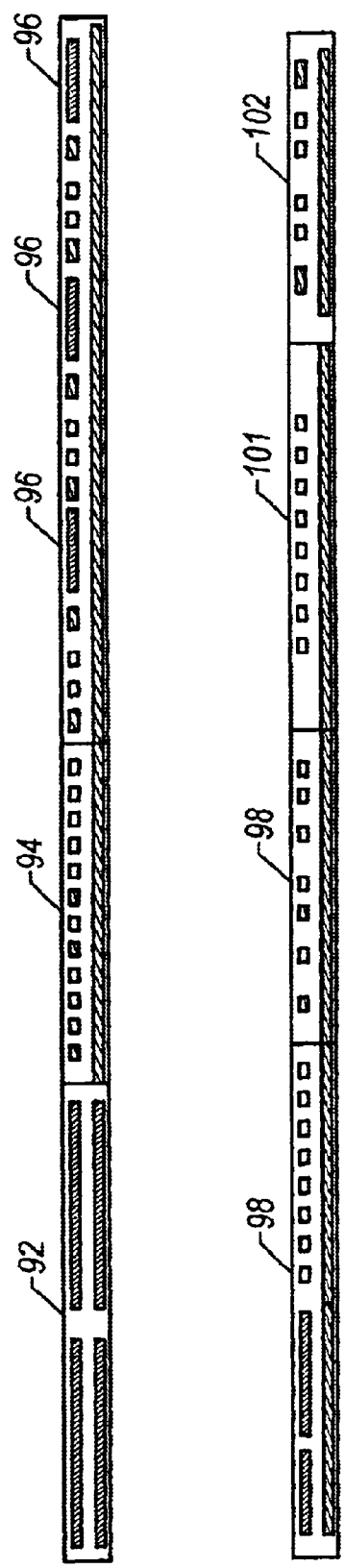

One potential cross-section of FPC is illustrated in FIG. 9. This FPC circuit comprises a poly layer or dielectric sandwiched between two copper layers within two polyimid substrates. In this case ground layer 82 and circuit layer 84 lie on either side of insulating layer 86. Ground layer 82 and circuit layer 84 may be referred to as a one-ounce, three-quarter ounce, or one-half ounce copper layer. This means that for a one-ounce FPC, one-ounce of copper is deposited on one square foot of FPC. Thinner copper layers provide increased flexibility, but also increased resistance. The outer layers, 88 and 90, comprise an upper and lower layer of poly that encloses the copper and dielectric sandwich. Ground layer 82 and circuit layer 84 may be etched using photolithography or other such methods known to those skilled in the art. Both the grounds and the data pathways may be patterned to present cross talk between signals. Insulating layer 86 may be polyester based dielectric, which serves as an insulator between the circuit pathways and the grounds. In the cross-sectional layout illustrated in FIGS. BA and 8B DC pathways are provided as power trace 92. VGA trace 94 is provided immediately to the right of the DC power trace 92. To the right of the VGA pathway are three high frequency USB connections with the appropriate USB traces 96, followed by a digital audio pathway and associated trace 98. A LAN data bus pathway 100, an IEEE 1394 trace 102 are also provided.

By minimizing the thickness of the different copper dielectric and poly layers the flexibility of FPC is increased. Increased flexibility allows FPC 64 to conform to tighter radius joints as the tension and compression across the height of FPC 64 is reduced as the height of FPC 64 itself is reduced. In some areas, it may be necessary to reduce the thickness of FPC 64 in tight radiuses or other torturous physical pathways. This is achieved by reducing the thickness of the copper layers from a one ounce to a three quarter or one-half ounce copper layer. In some-instances, the copper itself may be replaced by silverinc or other like materials to provide additional flexibility by reducing the thickness. In so doing an increased resistance from copper is incurred. Alternatively the conductive ground layer may be transformed from a solid continuous layer to a matrix or lattice with increased flexibility.

To increase the quality of the signals within FPC 64, separation zones 104 separate signal traces. Active signals are not placed in such proximity to each other as to cause cross talk between the signals. Furthermore, the DC power supply is separated from the high frequency data pathways such as the IEEE 1394 trace 102 in order to minimize contamination of the DC signal used by all systems within the tablet computer 10. This is one example of how the different electronic signals may be arranged on FPC 64 with the understanding that the methodology is to determine and understand the separation zones required for the different signal traces such that the signal traces and grounds may be horizontally separated to prevent contamination between the different signals.

The present invention also provides a carrying case or portfolio for a tablet computer, the carrying case being foldable between a closed position, open position, and standing positions. The case comprises an upper side divided into at least three stiffened sections. These sections include an uppermost section having at least one tab, an upright section, and a horizontal section. A lower side, which may be stiffened, couples to the upper side to form the exterior of the case. A formed metal frame within the case retains the tablet computer. Horizontal and/or vertical stops limit the-motion of the tablet computer relative to the frame. The frame assembly is held within the case by a retaining piece flexibly attached to the case. The frame includes track(s) operable to receive the tab(s) on the uppermost portion of the upper side, and wherein the tab(s) can be repositioned in the track(s).

Tablet computers are often used in vertical markets. The present invention provides a design whereby a tablet computer can be further advanced in horizontal markets. A vertical market is a market for products that serve a specific industry or task while a horizontal market is a more general market serving the general population as a whole. For example, a traditional desktop computer may fill the needs of a horizontal market while a workstation fills the needs of a vertical market such as the graphics users or engineering functions.

The present invention also provides a portfolio case that adapts the presentation and display of a tablet computer to a more general display or configuration commonly encountered in notebook configurations. This allows notebook users to ease into the use of the tablet computer by allowing notebook users to continue to use a keyboard and tracking device.

The portfolio case allows the tablet computer to be bundled with an input device such as a keyboard, which may be wireless or connected by a wired connection to a port on the tablet computer. This allows users to interface with the tablet computer in a more traditional notebook manner. Furthermore, the functionality of a convertible computer is incorporated into the portfolio case provided by the present invention. This portfolio case allows users to position the tablet and keyboard in a useable manner.

Figure 11:
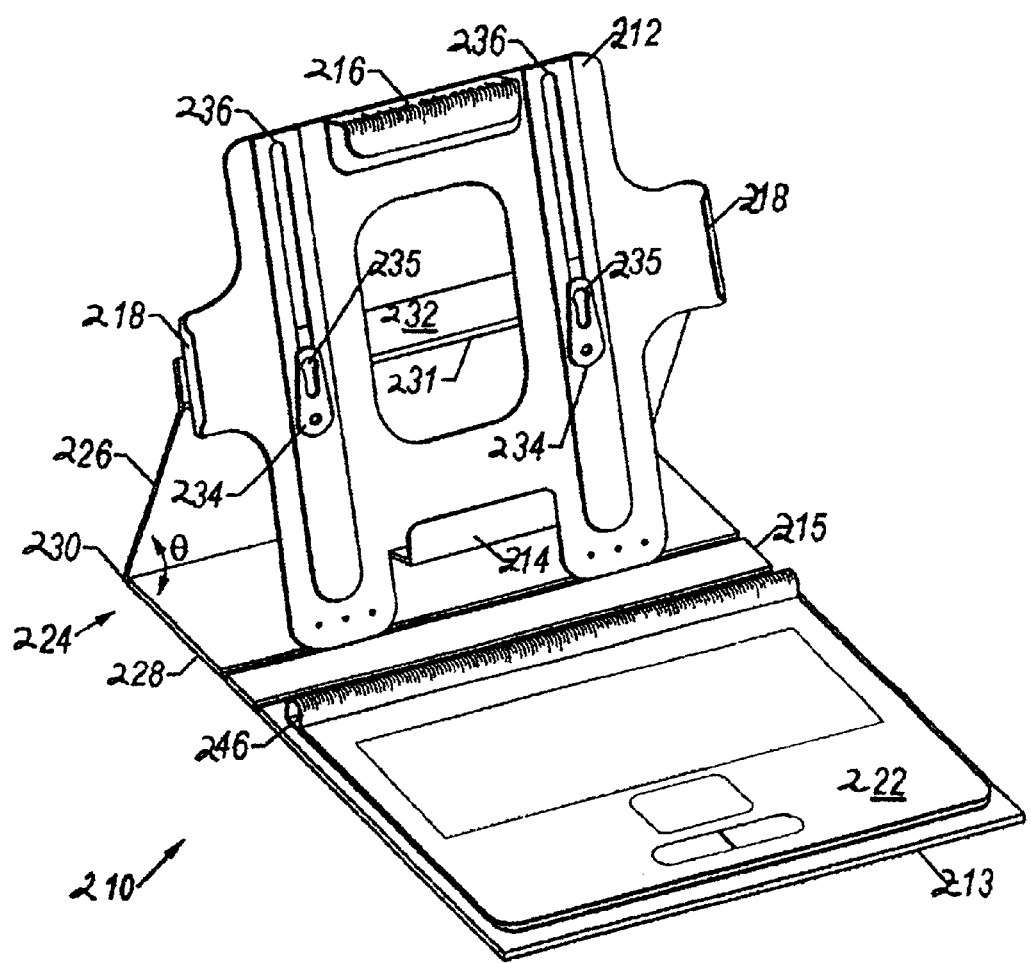
FIG. 11 provides a perspective view of the carrying case provided by the present invention.

One embodiment of the present invention is illustrated in FIG. 11. FIG. 11 depicts a portfolio case 210 for a tablet computer, (shown in FIG. 12). A metal frame 212 supports tablet computer 211 in a vertical or semi-vertical position. Holder 214, made of plastic or other compatible material, limits the vertical movement of the tablet computer 11 with respect to metal frame 212 in the download direction. Holder 216, made of plastic, rubber or other compatible material, prevents upward motion of the tablet computer with respect to the formed metal frame. The flexible nature of. Holder 216 permits easy access to the tablet in a closed portfolio. Flanges 218 limit the side-to-side motion of the tablet computer with respect to the formed metal frame.

The portfolio case 210 may be understood as having three distinct areas. Lower section 213 of portfolio case 210 retains a keyboard 222 with a wireless or cable connection to the tablet computer. A binding section 215 serves as any edge of portfolio case 210 and provides strength upon closing portfolio case 210. The upper section 224 is divided into an upper and lower section wherein the upper section 226 and lower section 228 are of such dimension and braced that fold 230 allows the formed metal frame to be positioned at various angles for the user. Section 232 of the upper portion of the case contains one or more tabs 235 which may be repositioned in tracks 236 to adjust the angle θ of metal frame 212. Clips 234 move along track 236, and may fasten to tab 235 to lock the tab in place. As tabs 235 move upward along track 236, angle θ decreases. Detents within the tracks may allow clips 234 to be set at pre-determined positions for specific angles θ.

Figure 12:
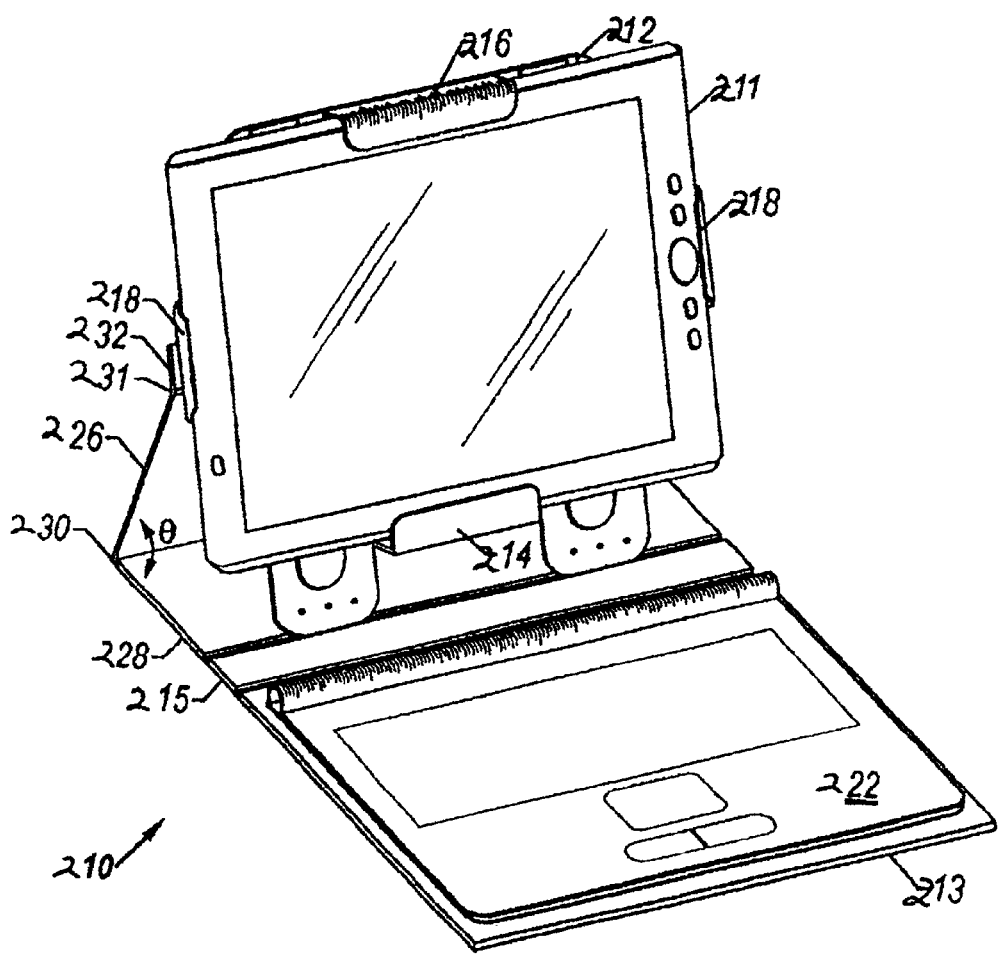
FIG. 12 provides a perspective view of the carrying case provided by the present invention with a tablet computer held in place.

FIG. 12 provides a second view of portfolio case 210 provided by the present invention with tablet computer 211 fixed in metal frame 212. In the embodiment of FIG. 12, tablet computer 211 may link to keyboard 222 via a wireless connection.

Figure 13A:
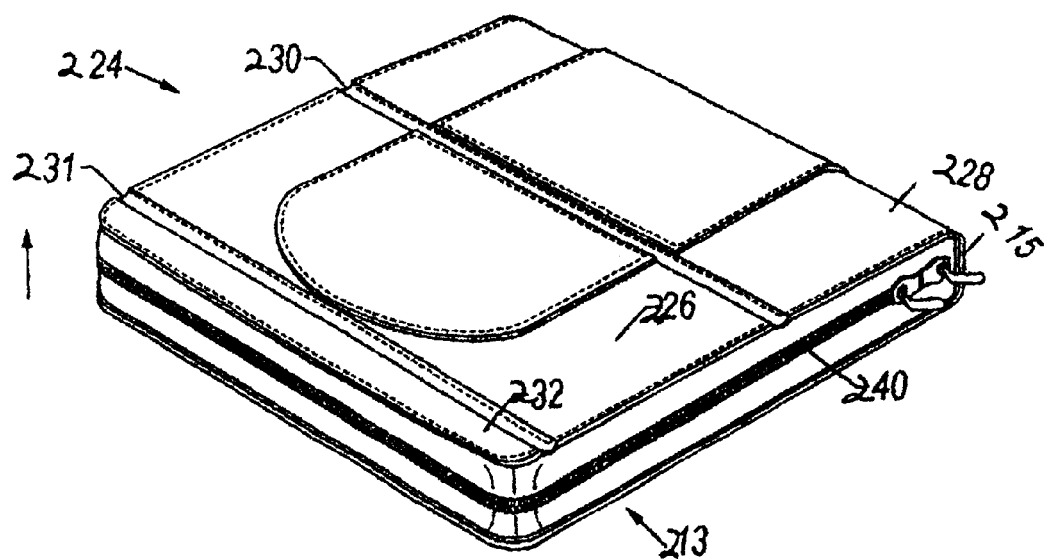
FIG. 13A provides a top view of one embodiment of the portfolio case in a closed position.
Figure 13B:
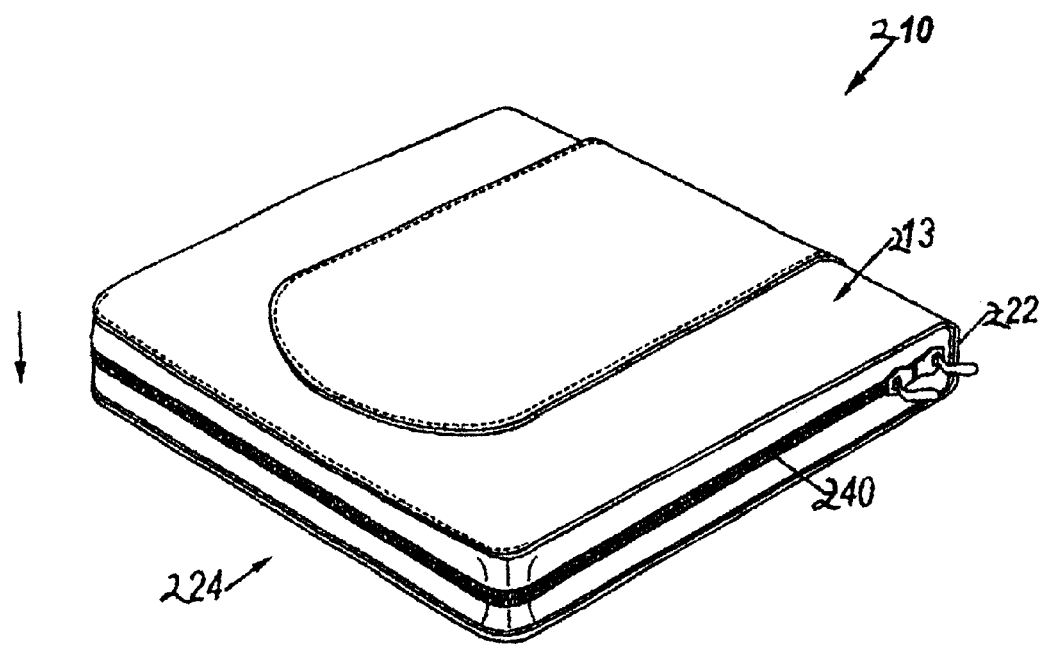
FIG. 13B provides a bottom view of one embodiment of the portfolio case in a closed position.

FIGS. 13A and 13B provide top and rear views of portfolio case 210 in the closed position. FIG. 13A depicts a top view of portfolio case 210 where folds 230 and 231 separate sections 232, 226 and 228. FIG. 13B provides a bottom view of one embodiment of the portfolio case of the present invention in a closed position. In FIGS. 13A and 13B, zipper mechanism 240 fastens upper 224 and lower section 213, of portfolio case 210. The present invention need not be fastened, or be fastened by a zipper, but rather any type of fastening portfolio fastening device known to those skilled in the arts may be used to close and secure the portfolio.

The upper section 224 and lower section 213 of portfolio case 210 may be stiffened. This allows the upper section to provide rigidity for portfolio case 210 in a standing or open position. Hence, folds 230 and 231 of upper portion 224 are not stiffened between hard sections 232, 226 and 228. Sections 232, 226, and 228 may be stiffened with a plastic or board stiffener, or other stiffeners known to those skilled in the art. The case itself may be made from PVC, nylon or other materials known to those skilled in the art that provides the desired look and feel.

Figure 14:
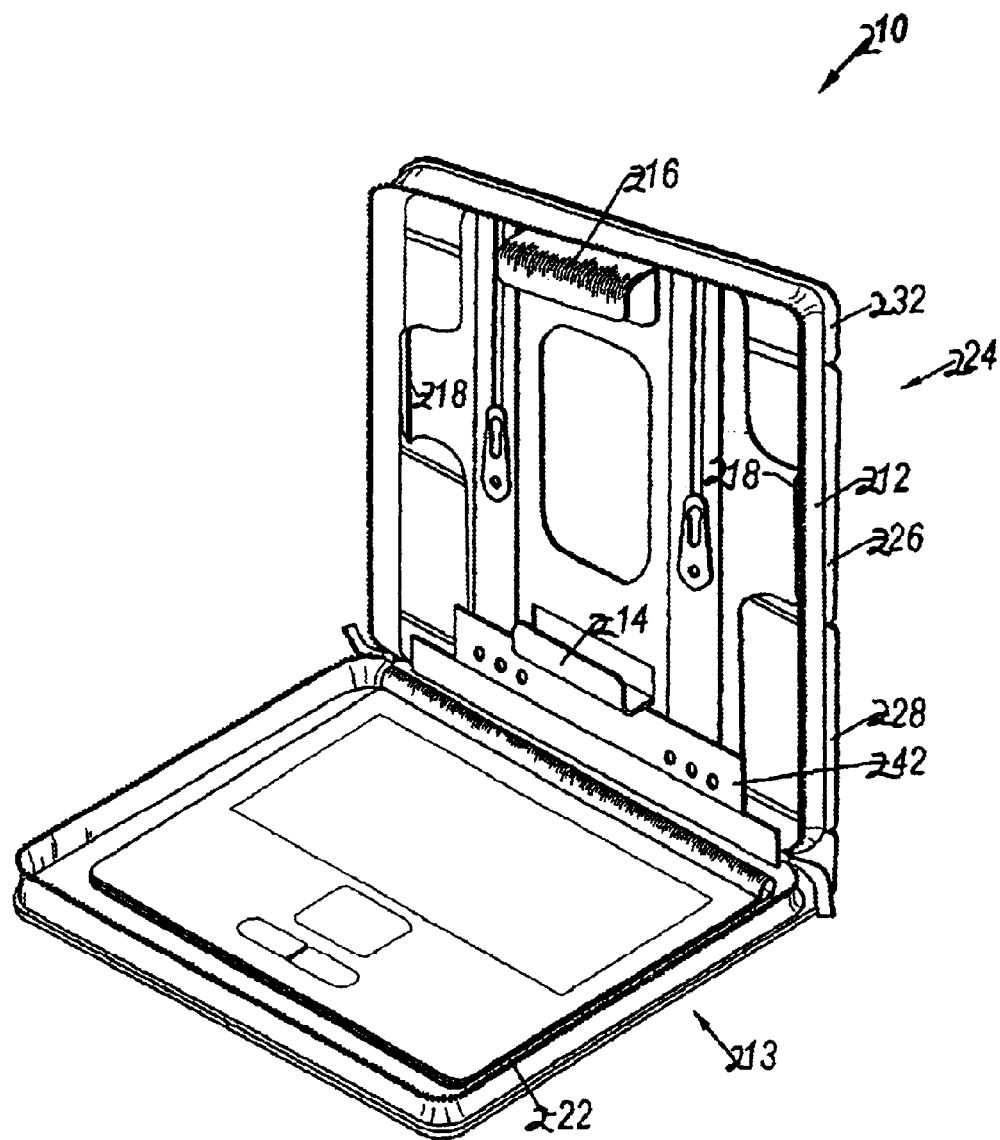
FIG. 14 illustrates one embodiment of the present invention in an open position.

FIG. 14 provides another view of portfolio case 210 in the present invention in an open position. Portfolio case 210 depicted in FIG. 14 is open but not in a standing position. Note that upper section 224 of the portfolio is not bent along folds 230 or 231. FIG. 14 shows that metal frame 212 may secure to upper section 224 by retainer 242. Metal frame 212 may be riveted to retainer 242. Other methods known to those skilled in the art may be used to secure metal frame 212 to retainer 242. Retainer 242 may be sewn into the portfolio case. The portfolio case itself may be lined with a polyester or nylon liner on the interior of the case in order to provide the desired look and feel. Additionally, retainer 242 may attach to be covered with a fabric material 244 to prevent rubbing between keyboard 222 and upper section 224 when portfolio case 210 is closed.

Holder 214 not only prevents tablet computer 211 from moving vertically with respect to the portfolio in an open position, but also prevents tablet computer 211 from contacting battery-storage section 246 of keyboard 222.

Figure 15:
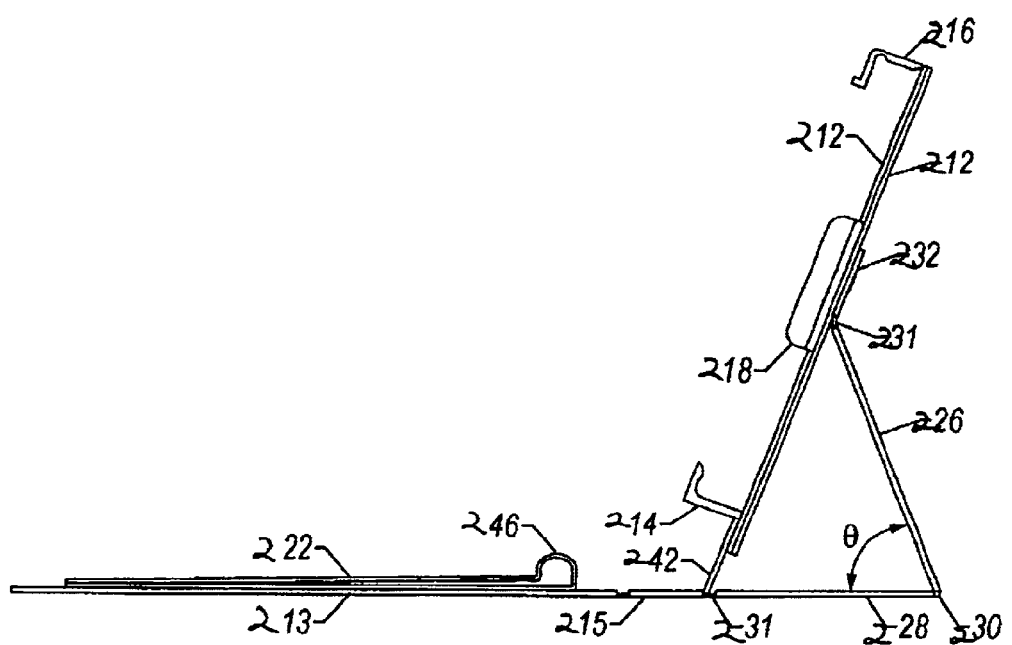
FIG. 15 provides a cross-section of the present invention in an open and standing position to support a tablet computer.

FIG. 15 provides a cross-section of the portfolio provided by the present invention in an open and standing position. In this cross-section, keyboard 222 is located on section 220 of portfolio case 210. Formed metal frame 212 is positioned at an angle of approximately 700 to enhance the ergonomic use of tablet computer 211. This angle $\phi$ may be adjusted by sliding clips 234 (FIG. 11) up and down tracks 236 to increase or decrease angle $\theta$ based on users preference. Sections 213, 215, 228, 226, and 232 are reinforced with stiffening material. The fact that sections 228, 226 and 232 are reinforced allows metal frame 212 to be braced and supported by the triangular brace formed by sections 226, 228, and the formed metal frame 212. The foot of metal frame 212 is held in place by retainer 242, which may be sewed or otherwise fastened to binding section 215 of the portfolio case.

Figure 16:
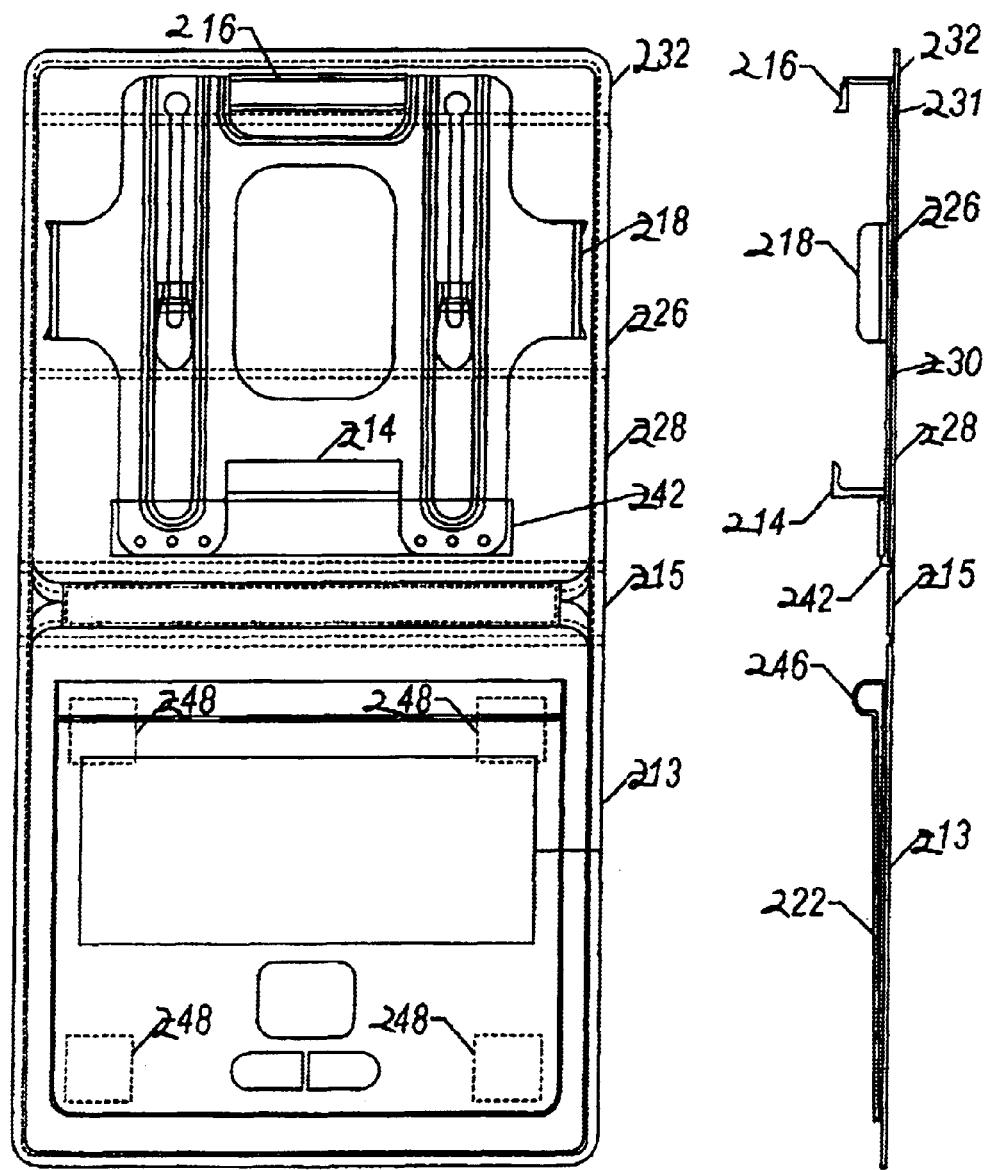
FIG. 16 provides a plan view of the portfolio case of the present invention with a frame and keyboard.
Figure 17:
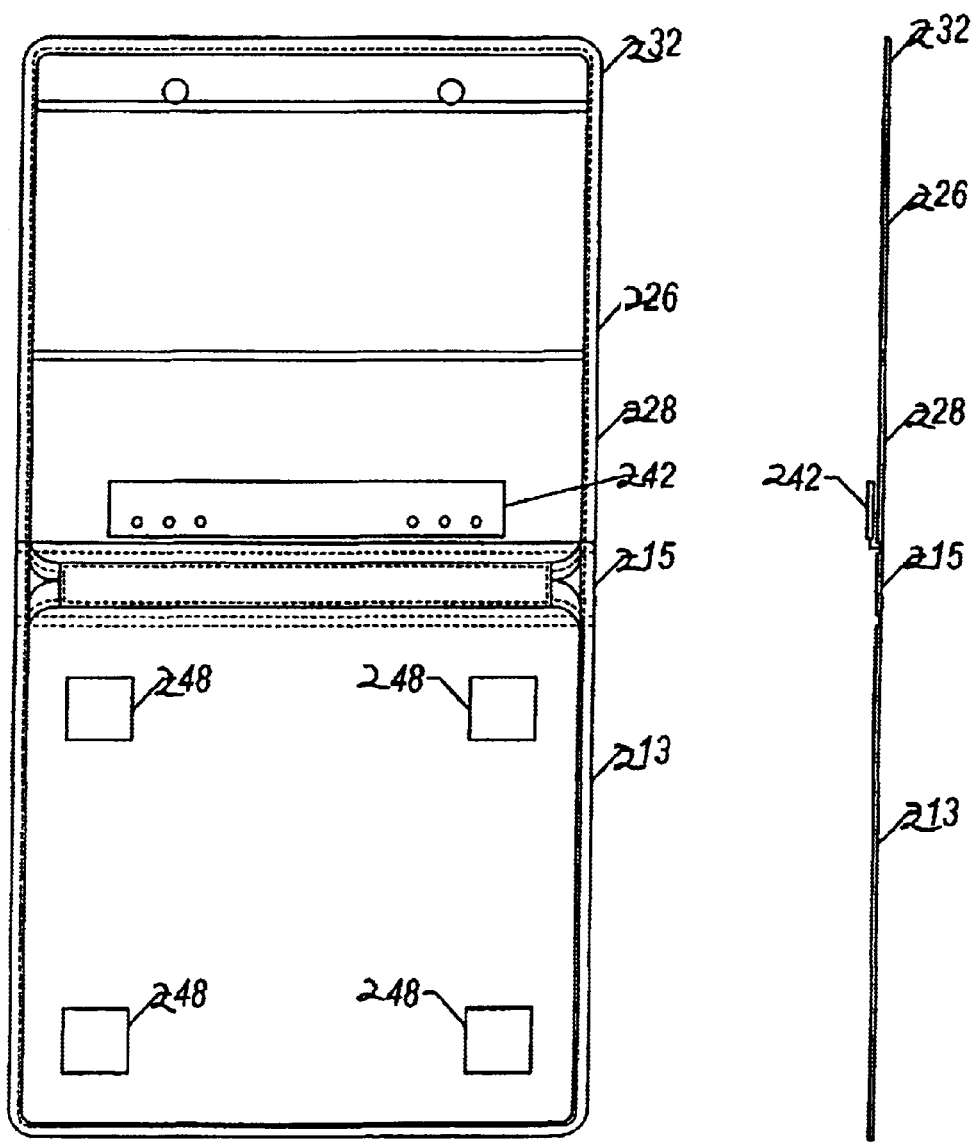
FIG. 17 depicts a plane view of the portfolio case of the present invention without a frame or keyboard.

FIG. 16 provides an engineering drawing and cross-sectional drawing of the portfolio case in a fully open position. Here, one may observe that keyboard 222 may be held in place with respect to the lower section 213 of portfolio case 210 by Velcro squares 248. It also shows that metal frame 212 is held in the upper section of the portfolio by retainer 242, which is fastened to binding section 215 of the portfolio. FIG. 17 provides a top-down and cross-sectional view of the portfolio without keyboard 222 or the formed metal frame 212 in place.

Figure 18:
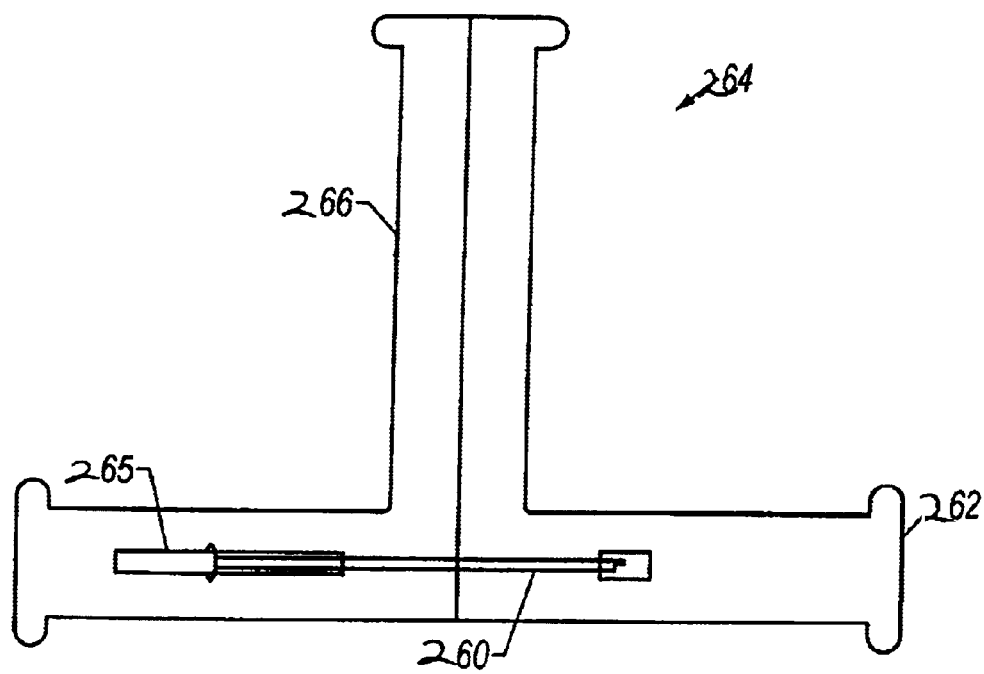
FIG. 18 depicts a support "L" brace in which a tablet computer may stand.
Figure 19:
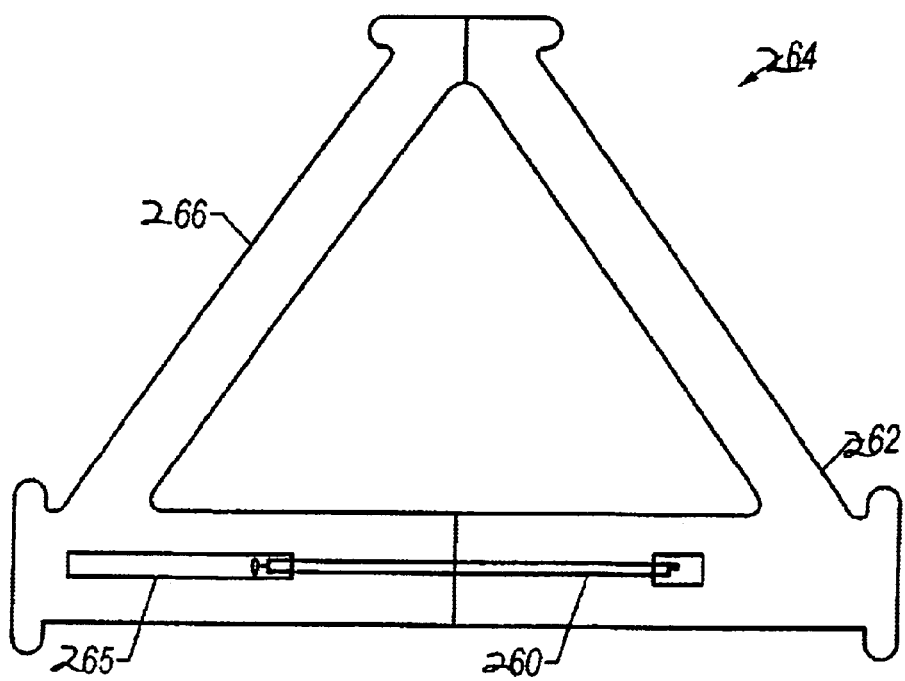
FIG. 19 depicts a support "A" brace in which a tablet computer may stand.

In another embodiment, the tablet computer discussed by the present invention may be supported by an "L" or "A" shaped bracket external to the case, thus allowing the table to be used as a stand-alone display. Two embodiments of this brace are shown in FIGS. 18 and 19. FIG. 18 depicts an L-shaped brace with a hinged support arm. In the embodiment shown in FIG. 18, the support arm is hingedly attached to the right-half 262 of brace 264. A track 265, left-half 260, allows the arm to move and the opening of the brace to be adjusted. Detents or other pre-determined fixes in the track 265 allow the brace to be opened to various pre-determined angles.

FIG. 19 contains a similar brace that is in the shape of an "A", as opposed to the "L" provided in FIG. 18. These braces may be incorporated into the back of the tablet computer to stand free of the case provided by the present invention. Additionally, the frame assembly may be attached to a support leg allowing the frame to stand freely.

The present invention provides a carrying case or portfolio for a tablet computer, the carrying case being foldable between a closed position, open position, and standing position. The case comprises an upper side divided into at least three stiffened sections. These sections include an uppermost section having at least one tab, an upright section, and a horizontal section. A lower side couples to the upper side to form the exterior of the case. A formed metal frame within the case retains the tablet computer. Horizontal and/or vertical stops limit the motion of the tablet computer relative to the frame. A retaining piece flexibly attached to the case holds the frame assembly within the case. The frame includes at least one track operable to receive the tabs on the uppermost portion of the upper aide, and wherein the tab(s) can be repositioned in the track(s).

The present invention provides an important advantage by allowing users to interface with a tablet computer in a manner and form similar to that of a traditional laptop. Furthermore, the case forms a brace that allows the tablet to be easily positioned in a quasi-vertical for viewing. This is true whether the tablet is used for a presentation or is to be repositioned for more comfortable viewing. This frame also provides a benefit in that the frame in certain embodiments may be removed or detached from the case and serves as a display stand or mount for the tablet.

The carrying case provided by the present invention serves to protect a tablet and enable users to interact with a tablet in the same manner they would with a traditional laptop. Thus, users may be eased into the tablet environment. The carrying case also serves to protect the tablet and keyboard, if present, from the environment. Additionally, the horizontal and vertical stops allow easy access to the tablet without opening the entire case. This is particularly advantageous in an airport where one must remove laptops for inspection. The upper vertical stop may be formed of a flexible material that bends to allow the tablet to be withdrawn from the case for inspection or easy access.

The present invention allows a tablet and keyboard to be easily carried from place to place as an integrated unit. Furthermore the present invention allows the tablet and keyboard to be repositioned in an ergonomical and comfortable position. The display may be oriented and fixed at a variety of angles allowing users to optimize the position of the display for their unique circumstance.

Although the present invention has been described in detail, it should be understood that various changes, substitutions and alterations can be made hereto without departing from the spirit and scope of the invention as described by the appended claims.

What is claimed is:

1. A docking station for a tablet computer, said docking station comprising:
    a docking assembly operable for positioning with three degrees of freedom, bearing a data connector for interfacing with said tablet computer;
    a support member for coupling said docking assembly to a base assembly, wherein said base assembly comprises a plurality of ports for interfacing with at least one peripheral device, and further wherein said plurality of ports are mounted on a printed circuit board;
    a flexible printed circuit for combining signal pathways for said plurality of ports and associating with said printed circuit board and said data connector.

2. The docking station of claim 1, further comprising a plurality of contact points positioned on an edge of said tablet computer for aligning said portable computing device to said docking assembly.

3. The docking station of claim 2, wherein said support member attaches to said base assembly with first joint and further wherein said support member attaches to said docking assembly with a second joint.

4. The docking station of claim 3, wherein said first joint comprises a hinge, and for supporting a movable brace support member.

5. The docking station of claim 3, wherein said second joint comprises a rotating socket.

6. The docking station of claim 3, wherein said flexible printed circuit routes through said first joint and said second joint.

7. The docking station of claim 3, wherein said docking assembly comprises a channel for receiving said portable computing device.

8. The docking station of claim 7, wherein said docking go assembly forms an "L", "J", or "U" shape.

9. The docking station of claim 8, wherein an upright tapered channel of said "L", "J", or "U" shape receives an upright edge of said portable computing device, when said computing device is operated in a landscape mode.

10. The docking station of claim 8, wherein a horizontal tapered channel of said "L", "J", or "U" shape receives a lower edge of said portable computing device, when said computing device is operated in a landscape mode.

11. The docking station of claim 1, wherein a display of said portable computing device reorients upon rotation of said docking assembly.

12. The docking station of claim 11, wherein'said display of said portable computing device automatically reorients upon rotation of said docking assembly by 90 degrees.

13. The docking station of claim 1, wherein said display of said portable computing device reorients when a user activates a function key on said portable computing device.

14. The docking station of claim 6, wherein said flexible printed circuit association with said docking generates minimal tearing stresses as said first and second joint flex.

15. The docking station of claim 1, wherein separation zones prevent cross-contamination of signals within said flexible printed circuit.

16. The docking station of claim 15, wherein said signals within said flexible printed circuit comprise a plurality of signals.

17. The docking station of claim 16, wherein said plurality of signals comprise signals selected from the group consisting essentially of: DC power, AC power, VGA, USB, analog audio, digital audio, analog video, digital video, LAN, WAN, and IEEE 1394.

18. A carrying case for holding a tablet computer, the carrying case being foldable between a closed position and an open position, the case comprising:
   an upper portion divided into at least three stiffened sections:
      an uppermost section having at least one tab;
      an upright section; and
      a horizontal section;
   a lower portion coupled to said upper portion; and
   a frame assembly for retaining the tablet computer, the frame assembly connectable to either said upper portion or said lower portion by a retaining piece, and wherein said frame assembly further comprises at least one track operable for receiving said at least one tab, said at least one tab repositionable in said at least one track.

19. A method for holding a tablet computer, the method comprising the steps of:
   positioning the-tablet computer in a carrying case, said carrying case comprising:
      an upper portion divided into at least three stiffened sections:
         an uppermost section having at least one tab;
         an upright section; and
         a horizontal section; and
      a lower portion coupled to said upper side, wherein said lower portion is operable to retain an input device in communication with the tablet computer; and
   retaining the tablet computer in a frame assembly, the frame assembly connecting to either said upper portion or said lower portion by a retaining piece, and wherein said frame comprises at least one track operable to receive said at least one tab, and positioning said at least one tab in said at least one track.

* * * * *